(12) United States Patent
Elsayed et al.

(10) Patent No.: US 11,543,370 B2
(45) Date of Patent: *Jan. 3, 2023

(54) DOWNHOLE METHOD FOR DETERMINING GEOLOGIC PERMEABILITY

(71) Applicant: King Fahd University of Petroleum and Minerals, Dhahran (SA)

(72) Inventors: Mahmoud Elsayed, Dhahran (SA); Ammar El-Husseiny, Dhahran (SA); Mohamed Mahmoud, Dhahran (SA); Karem Al-Garadi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 17/402,666

(22) Filed: Aug. 16, 2021

(65) Prior Publication Data

US 2021/0372956 A1 Dec. 2, 2021

Related U.S. Application Data

(63) Continuation of application No. 16/818,467, filed on Mar. 13, 2020, now Pat. No. 11,143,607.

(51) Int. Cl.
*G01N 24/08* (2006.01)
*G01V 3/32* (2006.01)

(52) U.S. Cl.
CPC .............. *G01N 24/081* (2013.01); *G01V 3/32* (2013.01)

(58) Field of Classification Search
CPC ................................. G01N 24/081; G01V 3/32
See application file for complete search history.

(56) References Cited

U.S. PATENT DOCUMENTS 11,143,607 B2 * 10/2021 Elsayed .................... G01V 3/32
2007/0099299 A1 * 5/2007 Simon .................... C07C 5/3335
436/37

(Continued)

FOREIGN PATENT DOCUMENTS

CN 104330433 A * 2/2015
CN 104330433 A 2/2015

(Continued)

*Primary Examiner* — Tarun Sinha
*Assistant Examiner* — Yossef Korang-Beheshti
(74) *Attorney, Agent, or Firm* — Oblon, McClelland, Maier & Neustadt, L.L.P.

(57) ABSTRACT

A method for predicting formation permeability by measuring diffusional tortuosity in several directions by pulse gradient NMR. The method comprises evaluating an anisotropic diffusion coefficient by pulsed gradient NMR, determining diffusional tortuosity from the restricted diffusion data, supplementing the NMR results with resistivity and sonic logging data, measuring anisotropic tortuosity and porosity by resistivity and sonic data and combining all components in a single fitting model. The 11-coefficient model is trained to recognize the true values of permeability by comparing the real oil permeabilities measured in a library of oil-carrying rock cores with the NMR, resistivity and sonic correlates. The fitting coefficients are extracted by minimizing the discrepancy between the laboratory measured permeabilities and the predicted values combining all rapid logging information components with the agreement-maximizing weights.

6 Claims, 26 Drawing Sheets

(56) References Cited

U.S. PATENT DOCUMENTS

| | | | |
|---|---|---|---|
| 2012/0273193 A1 | 11/2012 | Sen et al. | |
| 2013/0308831 A1* | 11/2013 | Dvorkin | G01N 33/241 382/109 |
| 2014/0285196 A1* | 9/2014 | Liu | G01N 24/081 324/309 |
| 2015/0153433 A1 | 6/2015 | Paulsen et al. | |

FOREIGN PATENT DOCUMENTS

| | | | |
|---|---|---|---|
| CN | 110609332 A | * | 12/2019 |
| CN | 110609332 A | | 12/2019 |
| RU | 2 292 541 C1 | | 1/2007 |

* cited by examiner

DOWNHOLE METHOD FOR DETERMINING GEOLOGIC PERMEABILITY

CROSS-REFERENCE TO RELATED APPLICATIONS

The present application is a Continuation of U.S. application Ser. No. 16/818,467, now U.S. Pat. No. 11,143,607, having a filing date of Mar. 13, 2020.

BACKGROUND OF THE INVENTION

Technical Field

The present disclosure relates to a method, system and apparatus for evaluating permeability anisotropy in hydrocarbon-carrying geological formations.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Permeability is an important parameter in evaluating reservoir quality and fluid flow of a hydrocarbon-containing subterranean geological formation or samples taken therefrom. Evaluating permeability anisotropy in layered or fractured reservoirs is important for production and stimulation planning. The term "permeability anisotropy" describes the ratio between the vertical and horizontal permeability of the geological formation, the latter being frequently larger (See J. R. Lishman, "Core Permeability Anisotropy," J. Can. Pet. Technol., vol. 9, no. 02, p. 7, April 1970). Permeability anisotropy evaluation is frequently conducted using either 3D images of rock samples, e.g., x-ray images (H. Sun, S. Vega, and G. Tao, "Analysis of heterogeneity and permeability anisotropy in carbonate rock, samples using digital rock physics," J. Pet. Sci. Eng., vol. 156, pp. 419-429, July 2017) or by extracting two different cores (R. Meyer, "Anisotropy of sandstone permeability," CREWES Research Rep., vol. 14, pp. 1-12, 2002) one parallel and one perpendicular to the layering direction (e.g., lamination of shale embedded in coarse sands). The development of a faster technique that can be implemented in the field can be of great significance in many science and engineering applications.

One such method is modeling permeability anisotropy by measuring diffusion coefficients using nuclear magnetic resonance (NMR). Such a technique may be applicable at both laboratory scale or by using an NMR downhole tool in the field. The restricted fluid self-diffusion measured in rocks by NMR equipment can be utilized to estimate the diffusion tortuosity, which in turn is strongly related to permeability. Since a magnetic gradient can be applied in different directions, the anisotropy of diffusion tortuosity and thus permeability can be evaluated.

Vertical boreholes are fortified by steel casing, and in order to extend hydrocarbon production operations the casing is perforated, and horizontal or arbitrary angle channels are drilled in the rock. These daughter channels are not cased, but instead form the starting sites for fracturing or acid treatment. The identification of maximum and minimum permeability from NMR diffusion measurements aligns the main vertical borehole casing perforations with the maximum permeability zones, improving oil and gas productivity.

Real-time NMR logging applies to the measurement of permeability anisotropy during drilling both vertical and horizontal wells. Evaluating permeability anisotropy in hydrocarbon-carrying formations is important in applications such as for fluid flow simulation and production planning in hydrocarbon reservoirs and aquifers. The latter is particularly important where petrophysical characteristics vary with depth. Current techniques for evaluating permeability anisotropy require either 3D imaging of rock cores or extraction of cores from two different directions; one parallel and one perpendicular to the layering. Both techniques are time-consuming and limited to laboratory investigation. Consequently, timely evaluation of in-situ permeability anisotropy in the wellbore remains a challenge.

The importance of anisotropy analysis follows the engineering fundamentals of both (a) hydrocarbon flow under stimulating conditions and (b) hydraulic fractioning stimulating hydrocarbon extraction. Regarding the aspect (a), the hydrocarbon strata exist under lithostatic pressure that increases nearly linearly with the depth of the formation and respective hydrocarbons. Hydrocarbon-rich strata follow the Laplace law of isotropic pressure distribution. Thus, an uncompensated horizontal pressure component directed toward the borehole develops in a compressed formation.

Viscous fluids escape towards the downhole following the Darcy-Weisbach equation:

$$\frac{\Delta p}{L} = \frac{128}{\pi} \cdot \frac{\mu Q}{D_c^4}, \tag{1}$$

where $\mu$ is the dynamic viscosity of the fluid (Pa·s=N·s/m$^2$=kg/(m·s)); Q is the volumetric flow rate of the hydrocarbon, used to measure flow instead of mean velocity according to Q=$\pi$/4Dc$^2\langle v\rangle$ (m$^3$/s), $\Delta P$ is the horizontal component of the lithostatic pressure (N/m$^2$), L is the length of the escape route (m). The equation (1) is entirely applicable to natural gas and to richer oil deposits capable of forming continuous paths that pass the pressure from site to site. Equation (1) is less applicable to depleted deposits in need of stimulation, since the lack of hydraulic continuity violates the assumptions of Darcy's derivation.

The viscous flow of hydrocarbons out of the formation is a function of the inverse 4$^{th}$ power of the equivalent pore diameter at a given horizontal pressure difference and therefore increasing the equivalent pore diameter increases the formation's productivity. The length L decreases productivity. Considering a rock unit volume and movement of a hydrocarbon element across this unit volume, it is apparent that productivity is sensitive to:

1) overall porosity (the volume, number and distribution of hollow pores in the rock),
2) tortuosity $\tau$ (the ratio of the actual path covered by a differential element of fluid in the rock volume to the straight-line length of the volume),
3) formation resistivity factor F (the ratio of electric resistance in a fluid-saturated porous media and the bulk permeating fluid), and
4) restrictivity (the number and extent of "bottleneck" situations, with cul-de-sacs considered to be the extreme chokepoints).

Tortuosity is known to be inversely proportional to overall porosity, and restrictive elements in the structure are specific to the formation (See Rezaee M R, Motiei H, Kazemzadeh E. A new method to acquire m exponent and tortuosity factor for microscopically heterogeneous carbonates. Journal of Petroleum Science and Engineering. 2007 Apr. 1; 56(4):241-51 incorporated herein by reference in its entirety).

Returning to the analysis by the Darcy equation, it is apparent that the calculated productivity may vary by orders of magnitude as a function of diverse aspects of formation microstructure. For example, a sample with the pore diameter 0.5 vs. 1 in a control, tortuosity 2 vs. 1 in the control and 50% of all paths ending in chokepoints vs 0% in the control is at least 64-fold less productive than the control. At lower porosities, the effects can be more dramatic. These observations necessitate measuring the petrophysical parameters before expanding drilling operations, at the earliest stage of exploration (e.g., before steel encasing and branching attempts) and preferably by a rapid in-situ logging method.

In the EOR (Enhanced Oil Recovery) contexts, the Darcy physics are applicable to the steam, flooding brine, flooding acid and fracturing fluids. The pressure loss during these procedures and the expected yield of the detached, liberated or solubilized hydrocarbon moving with heterogenous or aqueous continuous phase can be computed with the knowledge of permeability as well.

Typically, stimulated extraction of hydrocarbons involves hydraulic fracturing. Fracturing occurs when pressurized fluid (e.g., saline), mixed with proppants and viscosity modifying gels (to prevent proppant sedimentation) contacts pores and micro-defects on carbonate or sandstone surfaces facing the cased drilling pipe. Assuming no such initial micro-defects, it is difficult to propose an alternative mechanism of macroscopic fracture formation. The pores are typically within the range of compressive elastic deformation, and many are closed by lithostatic pressure. The acting forces are approximately balanced in both vertical and horizontal direction around a closed pore in a compressed rock. In the proximity of the drilling borehole, the horizontal component of pressure acting on a pore is asymmetric. A horizontal force acting on the pore's "bottom" on the rock's side is not compensated by an equal force on the fracturing "mouth" pore side. The reaction forces developing in this context act against the compressive effect of the vertical pressure and combine with the forces of hydrostatic pressure gradient, capillary pressure and the additional pore-opening pressure gradient component provided by fracturing pumps. Together, these parameters define a fracture gradient (FG), and its correct prediction is important for economically viable stimulated hydrocarbon production (See Eaton B A. Fracture gradient prediction and its application in oilfield operations. Journal of petroleum technology. 1969 Oct. 1; 21(10):1-353; Liang, Q. J., 2002, January. Application of quantitative risk analysis to pore pressure and fracture gradient prediction. In SPE Annual Technical Conference and Exhibition. Society of Petroleum Engineers; Zhang J, Yin S X. Fracture gradient prediction: an overview and an improved method. Petroleum Science. 2017 Nov. 1; 14(4): 720-30—incorporated herein by reference in its entirety). The subject is of significant impact due to a possibility of over-fracturing and collapse of the tunnel's walls surrounding a tilted or a horizontal pipe, sourcing the fracturing fluids. Typically, in the overall scheme of stimulated production such horizontal paths branch off the main vertical shaft and the fracturing takes place in these branches ("perforation scheme" means perforating the casing of the central vertical downhole to develop the side routes). The fracturing process, however, is self-propagating, once it starts at a given FG. The primary fissures engender secondary fissures, and flood-work stability would require maintaining the weakened tunnel under a higher working fluid pressure all the time (See Asgian, M. I., Cundall, P. A. and Brady, B. H. G., 1995. The mechanical stability of propped hydraulic fractures: a numerical study. Journal of Petroleum Technology, 47(03), pp. 203-208; Bernt S. Aadnoy, Reza Looyeh, in Petroleum Rock Mechanics (Second Edition), 2019—each incorporated herein by reference in its entirety). This leads to increased fluid loss, aquifer contamination and greater ecological concerns. Thus, it is important to correctly estimate all components of the fracturing gradient, including rock wettability, pore mouth sizes and geometry to correctly plan the borehole family, the depth, angles and number of branches, the working pressure of fluids. These objectives superimpose on the previously considered permeability management. Therefore, determining the porosity characteristics of formation rocks as soon as drilling allows is a pivotal step in running a stimulated drilling process with high ROI (return on investment).

Proton Nuclear Magnetic Resonance is applicable for the measurement of porosity and tortuosity in-situ. The initial formula for extraction of diffusion coefficients from the NMR pulse sequence data are provided in Stejskal, E. O.; Tanner, J. E. in the publication titled "Spin Diffusion Measurements: Spin Echoes in the Presence of a Time-Dependent Field Gradient" in the *Journal of Chemical Physics*, 1965, 42 (1): 288 incorporated herein by reference.

$$\frac{S(TE)}{S_0} = \exp\left[-\gamma^2 G^2 \delta^2 \left(\Delta - \frac{\delta}{3}\right) D\right] \quad (2)$$

where $S_0$ is the signal intensity without the diffusion weighting,
S (TE) is the signal with the magnetic field gradient,
$\gamma$ is the gyromagnetic ratio,
G is the strength of the gradient pulse, $\delta$ is the duration of the pulse,
$\Delta$ is the time between the two pulses, and finally,
D is the diffusion coefficient.

The pulsed NMR of Stejskal et. al. can be fine-tuned for anisotropic materials and the 13-interval APGSTE sequence is a preferred method because it takes into account magnetic field pulses in multiple dimensions, therefore measuring diffusion coefficients in different directions. The signal attenuation ($S/S_0$) for the 13-interval APGSTE sequence is given by a variation of the Stejskal and Tanner equation (2):

$$\frac{S}{S_o} = \exp\left\{-D_R\gamma^2\left[\delta^2\left(4\Delta + 6\lambda - \frac{2\delta}{3}\right)g_a^2 + 2\lambda\delta(\delta_1 - \delta_2)g_a g_0 + \frac{4}{3}\lambda^3 g_0^2\right]\right\} \quad (3)$$

where
$S_0$=NMR signal in the absence of applied magnetic field gradients (μV).
$D_R$=Restricted self-diffusion coefficient of the fluid (m$^2$/s),
$\Delta$ is the duration between two applied magnetic field 'Diffusion Time' (msec),
$\delta$ is the duration of the applied magnetic field gradient (msec).
$\gamma$ is the gyromagnetic ratio of the nucleus being studied (=2.68×10$^8$ Hz/T for $^1$H nucleus).
$g_a$ is the strength of the applied magnetic field gradient (T/m),
$g_o$ is the strength of the internal magnetic field gradient (T/m).

λ is the time between the first two (π/2) RF pulses (msec), and and δ$_1$ and δ$_2$=pre- and post-pulse time respectively (msec).

The publication by Dvinskikh S V, Furo I. (See "Measurement of the principal values of the anisotropic diffusion tensor in an unoriented sample by exploiting the chemical shift anisotropy: 19F PGSE NMR with homonuclear decoupling". Journal of Magnetic Resonance. 2001 Jan. 1; 148 (1):73-7—incorporated herein by reference in its entirety) teaches PGSE with dipolar decoupling extended to polycrystalline solids and unoriented liquid crystals. Decoupling suppresses dipolar dephasing not only during the gradient pulses but also under signal acquisition so that the detected spectral shape is dominated by the chemical shift tensor of the selected nucleus. The decay of the spectral intensity at different positions in the powder spectrum provides the diffusion coefficient in sample regions with their crystal axes oriented differently concerning the direction of the field gradient. Hence, one can obtain the principal values of the diffusion tensor. The method is demonstrated by 19F PGSE NMR with homonuclear decoupling in a lyotropic lamellar liquid crystal. The method is not directed to hydrocarbon reservoirs and is not 1H NMR.

US2018348396 discloses a method for determining permeability in subsurface anisotropic formations. An effective permeability K (or a permeability component) can be determined using conventional log data-derived permeabilities (e.g., using NMR, RDT, sonic, and/or resistivity logs). Permeability components can be determined using resistivity anisotropy data obtained from MCI measurement data and the effective permeability K from conventional permeability logs. This disclosure focuses on fluid filling porespace behavior. Also, all the NMR techniques used in this study are either relaxation experiment (T1 and T2) or multi-dimensional techniques (COSY, EXSY, spin-diffusion). The publication does not teach rock anisotropy but rather fluid properties.

US2017285215 discloses pore fluid phase behavior measurements. Laplace inversion algorithms may be used to process adsorption and NMR data to obtain a multi-dimensional distribution of adsorption and NMR relaxation parameters, which contain the key information regarding the micro-porosity and gas storage mechanism for even a single-component fluid. The reference does not focus on measuring of tortuosity and use of APGSTE 13 pulsed NMR sequence.

WO19232299 discloses a method for assessing pore-throat size distribution and permeability of porous media. The method includes using:

(a) NMR data which correlate to hydraulic tortuosity (rH),
(b) an electrical constriction factor (CE) from the measurements that correlates to hydraulic constriction factor (CH), and
(c) pore-size distribution (rP) and effective pore radii calculated from the NMR data, and
(d) a connected porosity (cpc) estimated from the NMR data, in porous media where total pore volume is approximately equal to the connected pore volume or estimated from three-dimensional pore-scale images of the section of the porous media.

The NMR method comprises measuring the relaxation time of the transverse magnetization decay (T2) using a 2 MHz Magritek NMR Rock Core Analyzer with a CPMG pulse sequence. The CPMG sequence is distinct from APGSTE 13. The image analysis is relatively cumbersome. The disclosure estimates bulk rock properties based on pore size distribution (no consideration of permeability anisotropy).

The patent teaches the use of T2 measurements by applying PFG family NMR signal sequence measured at different directions.

RU2292541C1 discloses applying a visible mark on the specimen to measure an angle of rotation of the specimen around its axis, saturating the specimen with a proton-containing liquid, setting the specimen into the spectrometer, making the visible mark coincident with the direction along the chosen axis of the laboratory coordinate system, setting the specimen in rotation around its axis with a uniform speed until the rotation angle between the mark and direction along the laboratory coordinate axis reaches 360°. For every current rotation angle, the measurement of the current angular amplitude of the spin-echo signal from the proton-containing liquid is performed before and after the event. The anisotropy coefficient and the characteristics of the main axes of anisotropy of rock pore follows the data obtained for a given value of the pulse gradient. The method of RU2292541C1 is based on rotating sample (not changing gradient direction) around its axis with a fixed speed. The patent does not mention determining diffusion tortuosity which requires the measurements of restricted diffusion coefficient at different diffusion times (Δ).

US2004090230, incorporated herein by reference in its entirety, discloses an apparatus and method for determining porosity and permeability, as well as the characterization of fluids in the formation. The disclosure teaches means for determining anisotropic permeability where vertical permeability ($K_z$) differs from horizontal permeability ($K_{xy}$). The invention relies on Pulsed Field Gradient (PFG) pulse sequence. In a two-dimensional context, two different imaging techniques are commonly utilized, Fourier Imaging (FI) and Projection Reconstruction (PR), sometimes known as the back-projection imaging or inverse radon technique. In PR technique, the object to be studied is first subjected to a magnetic field. A one-dimensional field gradient is applied at several angles, and the NMR spectrum is recorded for each gradient angle. A first spectrum is recorded with the gradient at zero degrees to the +Y axis. A second spectrum is recorded with the gradient now at a one-degree angle to the +Y axis. The process is repeated for the 360 degrees between 0 degrees and 359 degrees. The recorded data can be converted into an image by a 2D Fourier transformation in cylindrical coordinates. The publication teaches estimating the permeability based on imaging. The method requires at least two MRI images, and fluid should be flowing while measuring. The reference does not discuss permeability anisotropy and diffusion tortuosity. The technique has a limited resolution that prevents capturing small features (<100 um).

US2007238969 discloses diffusion-based magnetic resonance methods for characterizing bone structure. The method relies on time-dependent diffusion coefficients along two different directions measured with a compensated pulsed field gradient sequence. Fractional anisotropy is estimated by a surface-to-volume ratio tensor calculated from PFG time-dependent diffusion experiments. This method includes estimating fractional anisotropy of bone structure by surface to volume (SAT)—short time regime— of PFG NMR diffusion experiment, not APGSTE 13. The use of diffusion tortuosity is not considered and applies not to hydrocarbon carrying formations.

US2019204248 discloses a method for nuclear magnetic resonance diffusion measurements, differentiating between intrinsic bulk diffusivity of the substance and the reduced diffusivity of the substance caused by restricted diffusion. The d-PFG pulse sequences are applied multiple times while the area parameters (q1) and (q2) are held constant and a gradient angle between the pairs of gradient pulses is varied. The first pair 304 is applied along a single direction (e.g., x-axis) and the second pair 306 is applied along a different direction (e.g., y axis). As the d-PFG pulse sequences are applied, the second direction is varied and the gradient angle between the pairs thus also varies. A plot of the NMR signal for different values of the gradient angle can potentially show modulation due to time dependent diffusion and diffusion anisotropy. This disclosure extract pore size distribution from the structure. This disclosure is using d-PFG to quantify the diffusion anisotropy. The d-PFG pulse sequence is applied multiple times to a fluid within a heterogeneous porous medium, using a variable mixing time (Tm) between the two diffusion periods ($\Delta 1$) and ($\Delta 2$). The publication teaches no specific application for permeability anisotropy.

It is therefore another object of the present disclosure to provide an improved method of tortuosity and porosity assessment in-situ under dynamic drilling situations in the hydrocarbon-bearing formations undergoing stimulation by contact with the high-pressure fluids. Real-time responses at a larger scale are linked to hydrocarbon output via relationships of economic efficiency. Another objective is large-scale modeling of the entire basin based on permeability at several locations.

SUMMARY OF THE INVENTION

According to a first aspect, the invention relates to an NMR-based method of restricted diffusion coefficient measurement under actual downhole drilling conditions, wherein the diffusion of protons in a fluid such as a drilling mud is coupled to porosity and tortuosity.

According to a second aspect, an NMR-based method utilizes gradient fields producing well-defined voxels of the environment's volume around a drilling installation comprising a downhole NMR apparatus. A Fourier transforms the spin echoes in each voxel to the coordinate, diffusion coefficient and strength of proton signals, indicating the spatial distribution of tortuosity and porosity in the formation.

According to a third aspect, an NMR-based method utilizes a sequence of 90-degree, 180-degree or partial degree radiofrequency pulses, magnetic gradient pulses of any polarity and direction and calculations capable of interpreting the spin-echo data and converting it in the diffusion coefficients.

According to a fourth aspect, the NMR-derived diffusion coefficients measured in the mud fluid bulk and in the adjacent 0-5 mm "skin" of the porous formation are compared, producing the restricted diffusion coefficients.

According to a fifth aspect, a critical length of time is allocated for observing asymptotically constant values of the restricted diffusion coefficients, and only these asymptotic values are used to compute tortuosity.

According to a sixth aspect, the bulk and restricted diffusion coefficients are computed in different directions and are related, forming the anisotropic tortuosity values.

According to a seventh aspect, the information of NMR analysis alone applies to predicting the formation permeability.

According to an eighth aspect, the resistivity and acoustic logging supplements the NMR-only information, also used to predict anisotropic tortuosity and porosity.

According to a ninth aspect, all sources of high-throughput logging information are combined in a single regression model, relating the observed permeabilities in the hydrocarbon-carrying cores and the corresponding NMR, resistivity and acoustic correlates.

According to a tenth aspect, the regression model is trained and improved by maximizing the agreement between the laboratory values of permeability and the predicted values based on combining NMR, resistivity and sonic signals with the fitted coefficients. The condition of minimal disagreement between the model and laboratory experiments defines values of the fitted coefficients.

According to an eleventh aspect, the samples for the study in the tenth aspect are procured globally and reflect diverse hydrocarbon reservoirs.

According to a twelfth aspect, 50% of data points are retained as a testing set allowing to extrapolate the training predictions and adjust the mathematical form to achieve good generalization for a new set of conditions (a new reservoir not a part of prior experimentation and measuring).

According to a thirteenth aspect, economic models are provided that relate the structure of the reservoir, permeabilities established by the inventive method, location of the drilling installation and the costs of the process.

According to a fourteenth aspect, the economic models include the perforation scheme of the vertical casing, the number of branching channels, the angles and the lengths of the branching channels, the extent of fracturing—all estimated with the metrics solely based on diffusional tortuosity or comprising diffusional tortuosity as an essential component of a more comprehensive model.

According to a fifteenth aspect, the planning of a branched well, the structure of hydrocarbon reservoir, permeability and wettability of the well's walls are all considered by a software based on the regression model with diffusional tortuosity as a sole or essential feature.

The foregoing paragraphs have been provided by way of general introduction and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
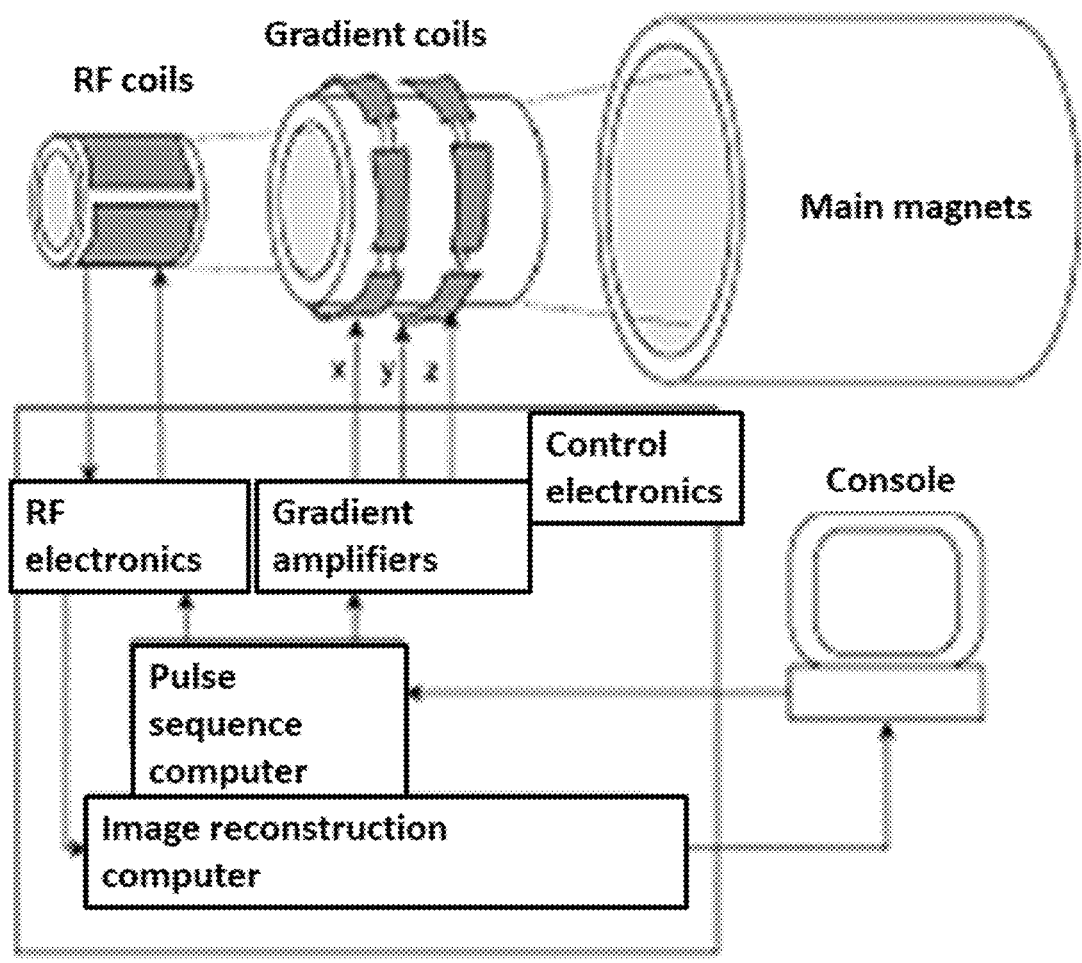
FIG. 1: The basic components of a gradient NMR installation.

Embodiments of the present disclosure will now be described more fully hereinafter with reference to the accompanying drawings, in which some, but not all of the embodiments of the disclosure are shown.

The present disclosure will be better understood with reference to the following definitions.

As used herein, the words "a" and "an" and the like carry the meaning of "one or more". Additionally, within the description of this disclosure, where a numerical limit or range is stated, the endpoints are included unless stated otherwise. Also, all values and subranges within a numerical limit or range are specifically included as if explicitly written out.

As used herein, the term "optional" or "optionally" means that the subsequently described event(s) can or cannot occur or the subsequently described component(s) may or may not be present (e.g. 0 wt %).

As used herein, the term "flip" and "flip angle" refers to the change in the orientation of the nuclear magnetic momenta in the primary magnetic field due to the absorption of radiofrequency pulse. The resulting macroscopic magnetic momentum gyrates with the resonant Larmor precession rate producing the signal detectable by a separate and the same radiofrequency coil (that produced the said pulse).

As used herein, the terms "collective", "global' and "macroscopic" are equivalent when referred to a transverse magnetization vector M, also mentioned as "net magnetization".

As used herein, the term T1 relaxation refers to re-orientation of the nuclear spins in the direction of the primary magnetic field along the axis Z form the transverse orientation in the plane X0Y perpendicular to the axis Z. As a result, the global magnetization vector turns by 90 degrees and aligns with Z.

As used herein, the term T2 relaxation refers to decohering of the spins in the transverse orientation to the primary magnetic field, after absorbing the energy of the RF pulse. The resonance nature of the energy transition leads to the same phase of precession for all spins and therefore the maximal possible transverse magnetization M value. Because of passing energy to the environment and field inhomogeneities, the individual magnetic momenta begin precession in different phases. The global magnetization minimizes, even without considering the re-orientation by the T1 mechanism.

As used herein, the term "spin echo" refers to the process of producing the maximal NMR signal after the RF pulse is turned off, explaining the term "echo". The phenomenon arises due to the presence of leading and lagging elements measured relative to the position of the global transverse magnetization vector M. Some spins "flip" first and some remain aligned with the primary field producing the lagging elements. The additional energy is supplied producing 180 degrees flip. In that stronger transverse magnetization environment, the individual spins feel the local field M as well as B and become synchronized in M not unlike the iron spin domains in a ferromagnetic after the magnetizing current is turned off. Since this focusing leads to maximization of the signal and takes place after the excitation energy is not provided any more, it was termed "echo".

As used herein, the term "NMR-derived diffusion coefficient" refers to the result obtained by a process of producing a signal in the detector coil by supplying RF energy to produce 90 degree or lower flip angle, destroying the signal by forcefully decohering the transverse magnetization vector by a magnetic gradient pulse, waiting a pre-set interval of time for the initial phase-labelled population of spins to diffuse away, and refocusing the phase-labeled spins by a combination of a RF pulse and a magnetic gradient pulse. Phase-labeling means that that the spins interacted with a first pair of RF and magnetic pulses will interact with a second pair, restoring the signal. The process, with variations, is termed "a sequence". The difference between the initial and the restored signal can be related to the diffusion coefficient by the Stejskal and Tanner sequence equations.

FIG. 1 presents the simplified scheme of a typical apparatus for modern NMR analysis. The installation comprises the main magnet, the gradient coils, the radiofrequency (RF) coils, RF electronics, gradient amplifiers, control electronics, operator console, pulse sequence computer and an image reconstruction computer. In operation, the main magnet produces a strong magnetic field in the range 0.5-3 Tesla. The gradient coils superimpose the additional (+) or (—) 0.1 Tesla contributions in the direction transverse to the axis Z (the axis of rotation inside the main magnet, the axis Z is aligned with the direction of the main magnetic field). Typically, one gradient is created in the direction of the axis X and another in the direction of Y. The extent of the gradient varies along Z. The result of the gradient application is partitioning of the space within the combined magnetic fields into small elements—voxels, which produce the diverse and voxel-specific resonance conditions. Based on Fourier series deconvolution it is possible to trace the spin echoes to the individual voxels (see below) and therefore reconstruct the spatial orientation of the factors affecting the signal magnitude (concentrations) and relaxation times (diffusion coefficients).

The magnetic fields interact with the nuclei possessing uncompensated spins (odd number of protons or neutrons, counted separately in a nucleus). The spins are quantum qualities, but they manifest empirically as circular currents running around the nuclei at very high velocity and creating magnetic momenta, expressed as a product of the current by the area of the conductive contour (Amper×m$^2$). The momenta are vector values and behave at a schematic level analogously to a macroscopic frame with an electric current placed in a magnetic field. Such a frame will align its normal vector ("magnetic momentum vector") with the direction of the field (axis Z), the macroscopic frame will "freeze" perpendicularly to the field.

The nuclei suitable for NMR comprise, without limitation, the following list of isotopes: $^{27}$Aluminium, $^{39}$Argon, $^{75}$Arsenic, $^{135}$Barium, $^{137}$Barium, $^{9}$Beryllium, $^{209}$Bismuth, $^{10}$Boron, $^{11}$Boron, $^{79}$Bromine, $^{81}$Bromine, $^{111}$Cadmium, $^{113}$Cadmium, $^{43}$Calcium, $^{13}$Carbon, $^{133}$Cesium, $^{35}$Chlorine, $^{37}$Chlorine, $^{53}$Chromium, $^{63}$Copper, $^{65}$Copper, $^{59}$Cobalt, $^{2}$Deuterium, $^{19}$Fluorine, $^{69}$Gallium, $^{71}$Gallium, $^{73}$Germanium, $^{3}$Helium, $^{3}$Hydrogen, $^{2}$Hydrogen, $^{3}$Hydrogen, $^{113}$Indium, $^{115}$Indium, $^{127}$Iodine, $^{57}$Iron, $^{83}$Krypton, $^{138}$Lanthanum, $^{139}$Lanthanum, $^{207}$Lead, $^{6}$Lithium, $^{7}$Lithium, $^{25}$Magnesium, $^{55}$Manganese, $^{199}$Mercury, $^{201}$Mercury, $^{95}$Molybdenum, $^{97}$Molybdenum, $^{21}$Neon, $^{61}$Nickel, $^{14}$Nitrogen, $^{15}$Nitrogen, $^{187}$Osmium, $^{189}$Osmium, $^{17}$Oxygen, $^{31}$Phosphorus, $^{195}$Platinum, $^{39}$Potassium, $^{40}$Potassium, $^{41}$Potassium, $^{1}$Proton, $^{103}$Rhodium, $^{85}$Rubidium, $^{87}$Rubidium, $^{45}$Scandium, $^{77}$Selenium, $^{29}$Silicon, $^{107}$Silver, $^{109}$Silver, $^{23}$Sodium, $^{87}$Strontium, $^{33}$Sulfur, $^{123}$Tellurium, $^{125}$Tellurium, $^{115}$Tin, $^{117}$Tin, $^{119}$Tin, $^{47}$Titanium, $^{49}$Titanium, $^{3}$Tritium, $^{183}$Tungsten, $^{235}$Uranium, $^{50}$Vanadium, $^{51}$Vanadium, $^{129}$Xenon, $^{131}$Xenon, $^{67}$Zinc. Of note, deuterium (2H) has the spin value+1, despite having an even number of protons and neutrons. However, the Pauli principle filling of energy levels in all quantum systems apply to each particle type individually; therefore the combination of a proton and a neutron with parallel spins is not banned at the same energy level and has a lower energy than an antiparallel combination, explaining the almost exclusive dominance of the triplet deuterium vs. a possible singlet state with the antiparallel spins. By contrast, two neutrons or two protons at the same energy level must have antiparallel mutually compensating spins being of the same nature.

The magnetic momenta of the nuclei should ideally align strictly along the axis Z, following the direction of the magnetic field B. However, this is impossible due to thermal motion conferring variable quantity of torque to the spinning nuclei, oriented in the magnetic field. Analogously to a mechanical toy "spinning top" or a gyroscope in gravitational fields, the introduction of the torque by the external forces alters the orbital momentum of the spinning system.

Newton's second law of motion can be expressed mathematically, $$F = m \times a \quad (4)$$

or force=mass×acceleration. The rotational equivalent for point particles may be derived as follows:

$$L = I \times \omega \quad (5)$$

Wherein I—is the momentum of inertia and ω—is the angular velocity. Thus, the torque τ (i.e. the time derivative of the angular momentum) is given as:

$$\tau = (dI/dt) \times \omega + I \times (d\omega/dt) \quad (6)$$

The equation (6) is the rotational analog of Newton's Second Law and the torque is not always proportional or parallel to the angular acceleration. The external torque introduces a perpendicular component to the original orbital momentum $L_z$ of the body spinning relative to the axis Z. Under the stationary conditions, this permanent perpendicular component is directed along the tangent to a circular trajectory of motion accepted by the top of the spinning body. The circular motion that establishes after reaching the stationarity phase (after dampening of nutational motion at the non-stationary phase) is termed precession. More than one precession motions are possible simultaneously, but for simplicity, only one is assumed in the plane X0Y, normal to the axis Z. Under these simplifying assumptions, the precession angular velocity is:

$$\omega_p = \frac{mgr}{I_s \omega_s} = \frac{\tau}{I_s \omega_s} \quad (7)$$

$$T_p = \frac{4\pi^2 I_s}{mgrT_s} = \frac{4\pi^2 I_s}{\tau T_s} \quad (8)$$

Where $\omega_p$—is the precession movement angular velocity, $T_p$—precession movement period, $I_s$—is the inertia momentum vs. the spinning axis, $\omega_s$—is the angular velocity vs. the spinning axis, i is the applied torque. Analogously to mechanical systems, a spinning particle in a magnetic field experiences a precession movement due to its interactions. When a magnetic moment μ is placed in a magnetic field B, it experiences a torque which can be expressed in the form of a vector product:

$$\tau = \mu \times B \quad (9)$$

Where μ is the magnetic momentum and B is the magnetic field. For the momentum coinciding with B, the torque is zero but is non-zero for a system permuted by thermal motion or charge-charge interactions. When a torque is exerted perpendicular to the angular momentum L, it produces a change in angular momentum ΔL which is perpendicular to L, causing it to precess about the Z-axis. Labelling the precession angle as φ, the effect of the torque can be described as follows:

$$\tau = \frac{\Delta L}{\Delta t} = \frac{L\sin\theta\Delta\phi}{\Delta t} = |\mu B\sin\theta| = \frac{e}{2m_e}LB\sin\theta \quad (10)$$

The L sin θ is the projection of the original orbital momentum L aligned with the axis Z onto the perpendicular plane X0Y as a result of torque. ΔL is the change of orbital momentum, and this change is equal to a vector difference ΔL between the component L sin θ at the time $t_1$ and the same component at the time $t_2$, resulting due to covering the angle Δφ in the precession. Also, $\mu=(e/2m_e)$ L in equation (10) provides a link between torque expressed through magnetic momentum and its equivalent expressed through angular momentum, both being proportional via gyromagnetic ratio ($e/2m_e$).

Considering the definition of torque according to (9) and elementary transformations produces the final form (11) below. The precession angular velocity (Larmor frequency) is $$\omega_{Larmor} = \frac{d\phi}{dt} = \frac{e}{2m_e}B \quad (11)$$

The analysis of (9)-(11) shows that both the original orbital momentum L and the perpendicular component L sin θ induced by the external torque are canceling in the final expression (11). This canceling is absent in the mechanical analogy above. The resulting precession frequency is inversely proportional to the inertia $m_e$ of the spinning particle, directly proportional to the charge e and the strength of the magnetic field B. The Larmor precession frequency is a characteristic of a particle in a magnetic field and does not reflect the strength of the permutations causing deflections from the axis Z (L sin θ is canceled). Yet as a quantum system, a single particle in this minimal energy state would absorb electromagnetic energy at the same frequency as Larmor precession.

A mechanical analogy is helpful to illustrate why the resonance condition is reached at the Larmor frequency. Assuming a heavy spinning top with an infinite momentum of inertia and periodic impacts by an external force, the energy transfer is the most effective when the period between the impacts is exactly equal to the period of precession. Moving from a laboratory coordinate system to the one originating in the precession spinning top leads to the external force arriving at different positions on the precession trajectory if the periods between the impacts and the precession period are different. Over an extended timeframe, the positions of impacts will find the opposing and equal counterparts, thus mutually neutralizing. For equal periods, the impacts arrive always at the same position, leading to the maximized accumulation of the transferred energy. The similar principle of the external force applied at the inner or natural frequency of oscillations defines the better-known conventional resonance.

Figure 2:
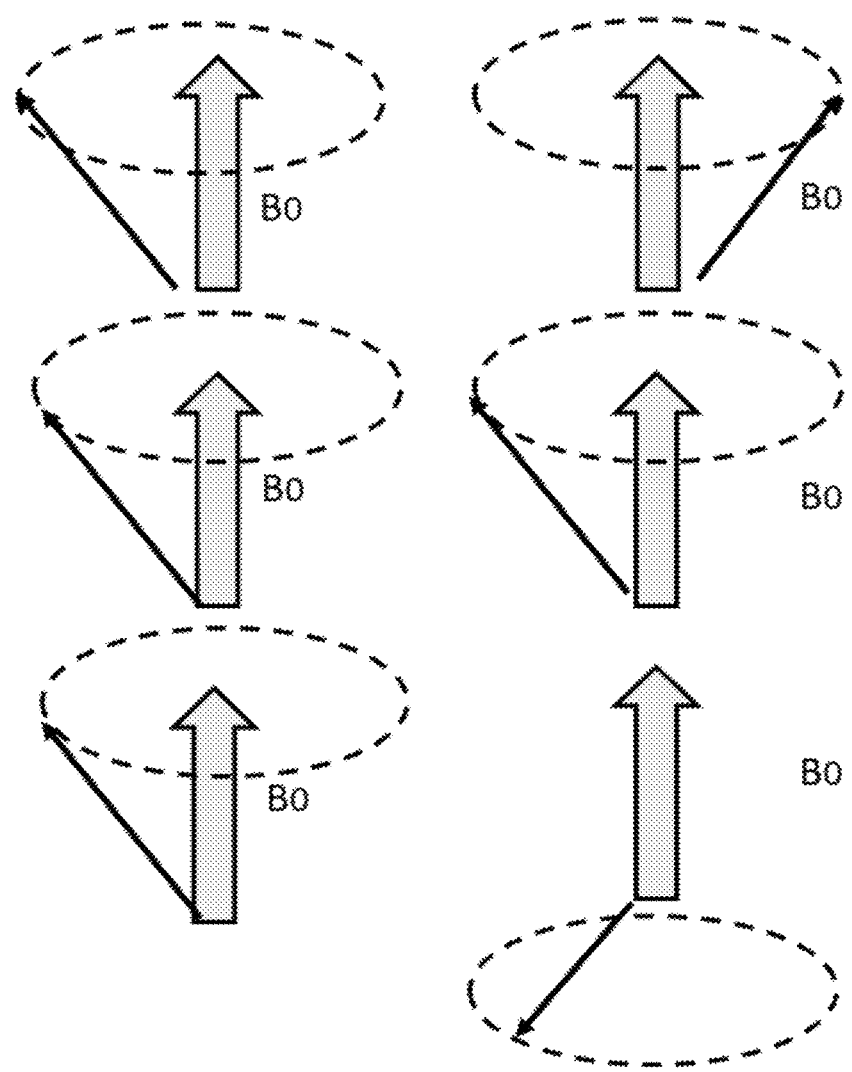
FIG. 2: The scheme of 90 degree flipping and synchronization for the global magnetization vector.

The individual nuclei oriented along the field B are at the minimal energy and, when excited by the electromagnetic wave originating in the radiofrequency coils (RF coil), they experience a resonance transition and "flip" the spins in the opposite direction (against the field). This process is time-dependent, and with longer exposure to the excitation energy at the frequency of Larmor precession, the progressively greater proportion of the individual nuclei changes orientation. If originally the summary magnetization vector (vector sum of all individual magnetic momenta) was directed along the axis Z with the field, upon "flipping" the summary magnetization vector rotates by 90, 180 or an arbitrary optimized angle without limitation. FIG. 2 demonstrates the scheme of "flipping" by 90 degrees of the collective magnetization vector.

According to FIG. 2, the initial orientation of the magnetic momenta is random for the nuclei in the background state (aligned with the field with Boltzmann equilibrium distribution describing the population of the energy levels). The only net magnetization component is the difference between the populations of the background and the excited states, with the predominant population in the background state (spin polarization). The upper position in FIG. 2 describes this stage. Upon sensing the RF pulse, the system gains energy by the alignment of the magnetic momenta in the same phase (lower entropy state, middle position). This phase coherence is a general property of resonance absorbance. For example, all mechanical pendulums experiencing resonance by the same external force are also expected to swing in the same phase. Also, the proportion of the energy levels changes due to the quantum transition to the excited states, corresponding to flipping some of the spins shown in the lowest position of the figure. The resulting "flipped" collective magnetic vector is the original collective magnetic vector turned by 90 degrees. In this orientation the net magnetic flux of the sample gyrates in the contour of the RF coils with the Larmor frequency, producing the maximal initial post-flip signal current. The current represents the decaying oscillations which reflect dephasing and relaxation of the high-energy magnetized state after RF pulse is turned off. The signals are proportional to the square of the primary magnetic field and directly proportional to the molar percent of the resonating nuclei. The signals can also be deconvoluted as exponential decays with the relaxation times T1 and T2, providing the most useful information about the state of the system. T1 relaxation is the process by which the net magnetization (M) grows/returns to its initial maximum value (Mo) parallel to Bo in FIG. 2. Synonyms for T1 relaxation include longitudinal relaxation, thermal relaxation and spin-lattice relaxation. The net magnetization along Z is zero during the action of the RF pulse due to the M vector flip. The net magnetization returns back to its Boltzmann distribution maximum by the equation:

$$M_t = M_{max}(1 - e^{-t/T1}) \quad (12)$$

Where $M_t$ is the magnetization at time=t, the time after the 90° pulse, $M_{max}$ is the maximum magnetization at full recovery. This type of relaxation was termed "spin-lattice" due to lattice or other external environments being the acceptors of the excessive energy in the magnetized material.

As the individual magnetization vectors align with the primary magnetic field, they simultaneously de-cohere since the completely random orientation of the precessions are more favorable energetically as a more probable state with higher entropy. T2 relaxation is the process by which the transverse components of magnetization ($M_{xy}$) decay or dephase. T2 relaxation is considered to follow first-order kinetics, resulting in a simple exponential decay (like a radioisotope) with time constant T2. Thus, T2 is the time required for the transverse magnetization to fall to approximately 37% (1/e) of its initial value. Synonyms for T2 relaxation are transverse relaxation and spin-spin relaxation (See Bloch F. Nuclear induction. *Phys Rev* 1946; 70:460-474, 1946, incorporated herein by reference in its entirety). T2 relaxation occurs whenever there is T1 relaxation. Some additional processes also exist (such as static local fields and spin "flip-flops") that cause T2 relaxation without affecting T1. T2 relaxation always proceeds at a faster rate than T1 relaxation.

Figure 3:
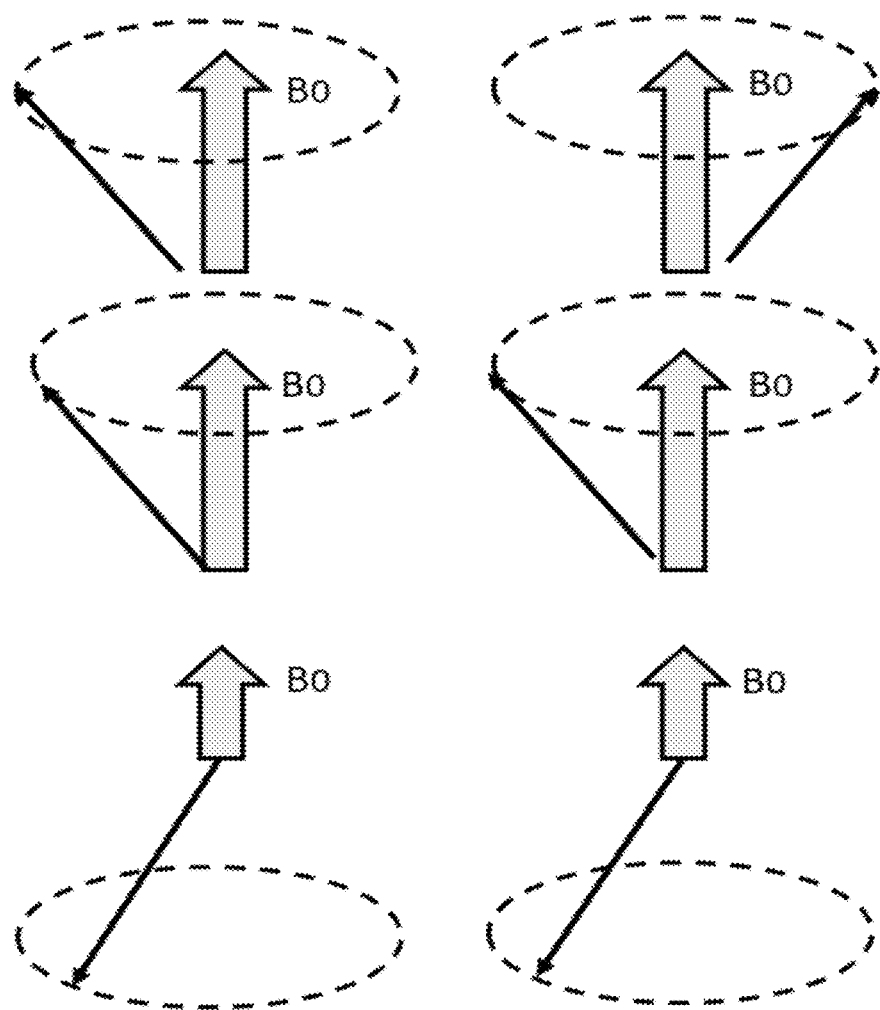
FIG. 3: The scheme of 180 degree flipping and synchronization for the global magnetization vector.
Figure 4A:
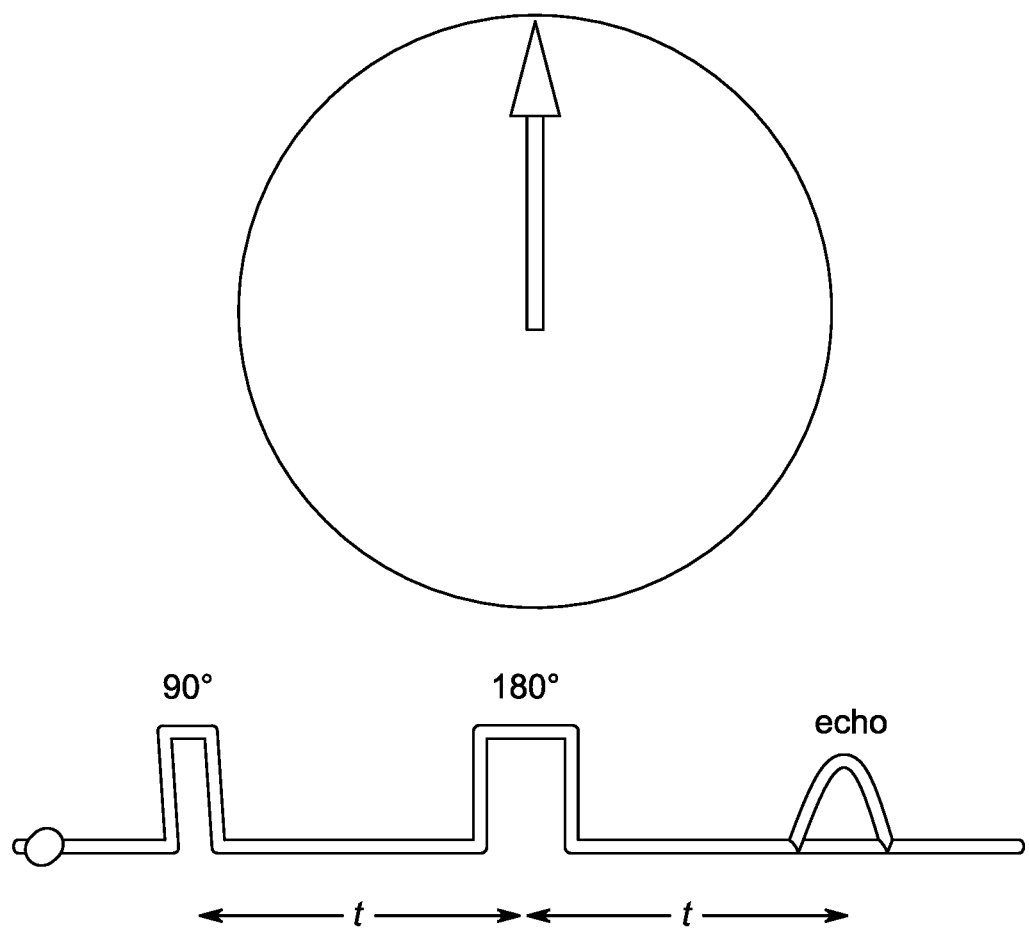
FIG. 4A. The initial orientation of the magnetization vector up-field.
Figure 4B:
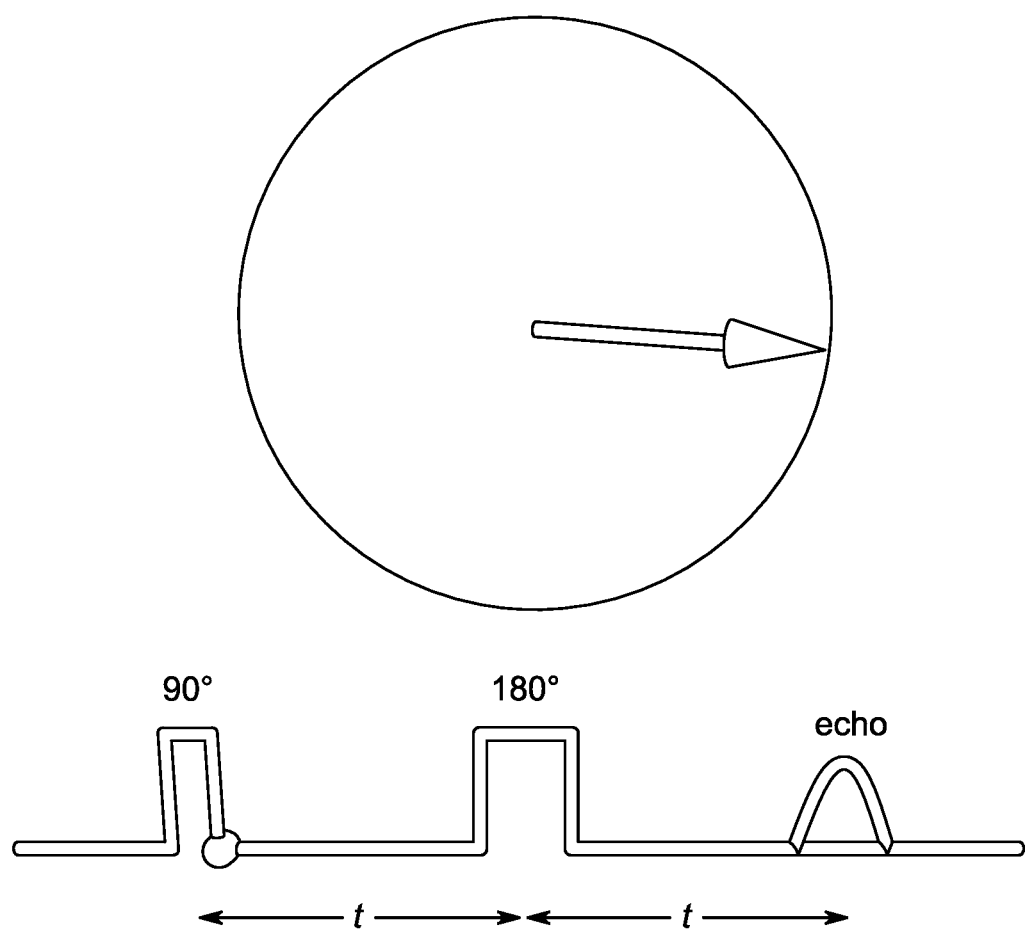
FIG. 4B. The initial focusing after the completion of 90 degree "flip".
Figure 4C:
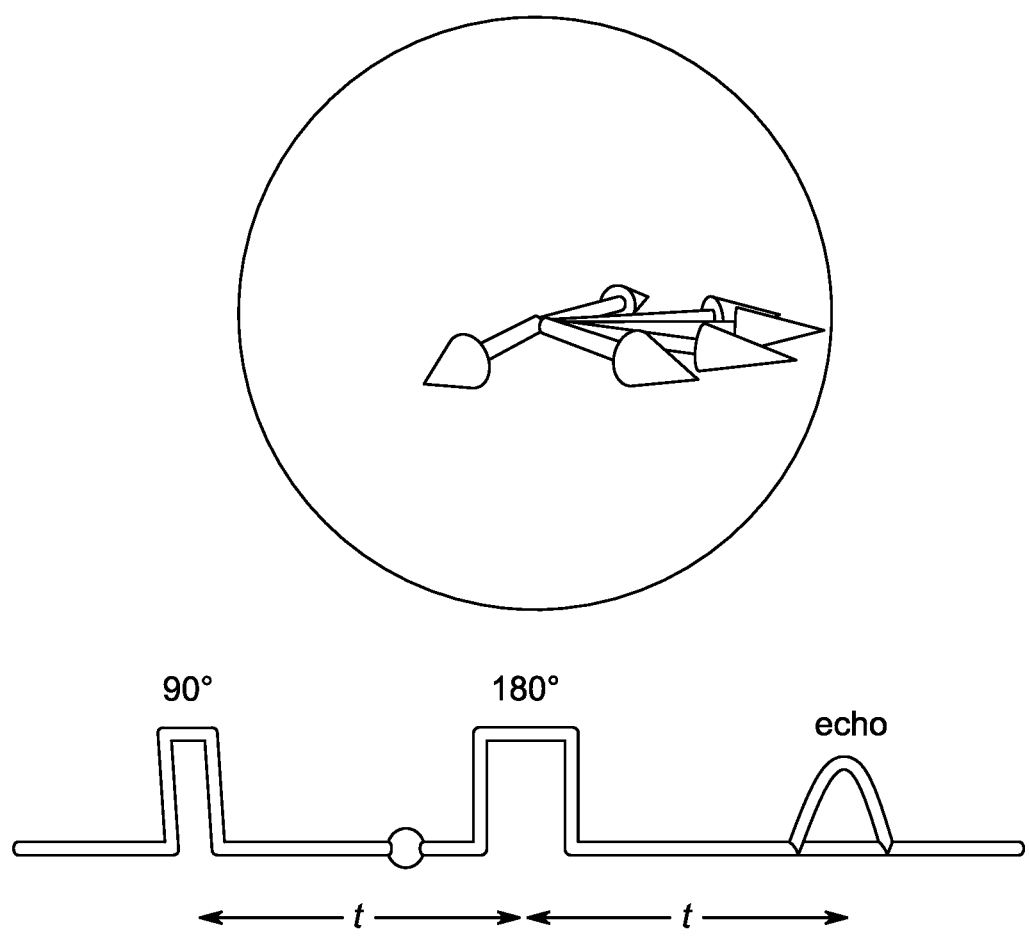
FIG. 4C. Relaxation of spins post 90-degrees focusing. Faster elements lose coherence fist, while the lagging remain focused.
Figure 4D:
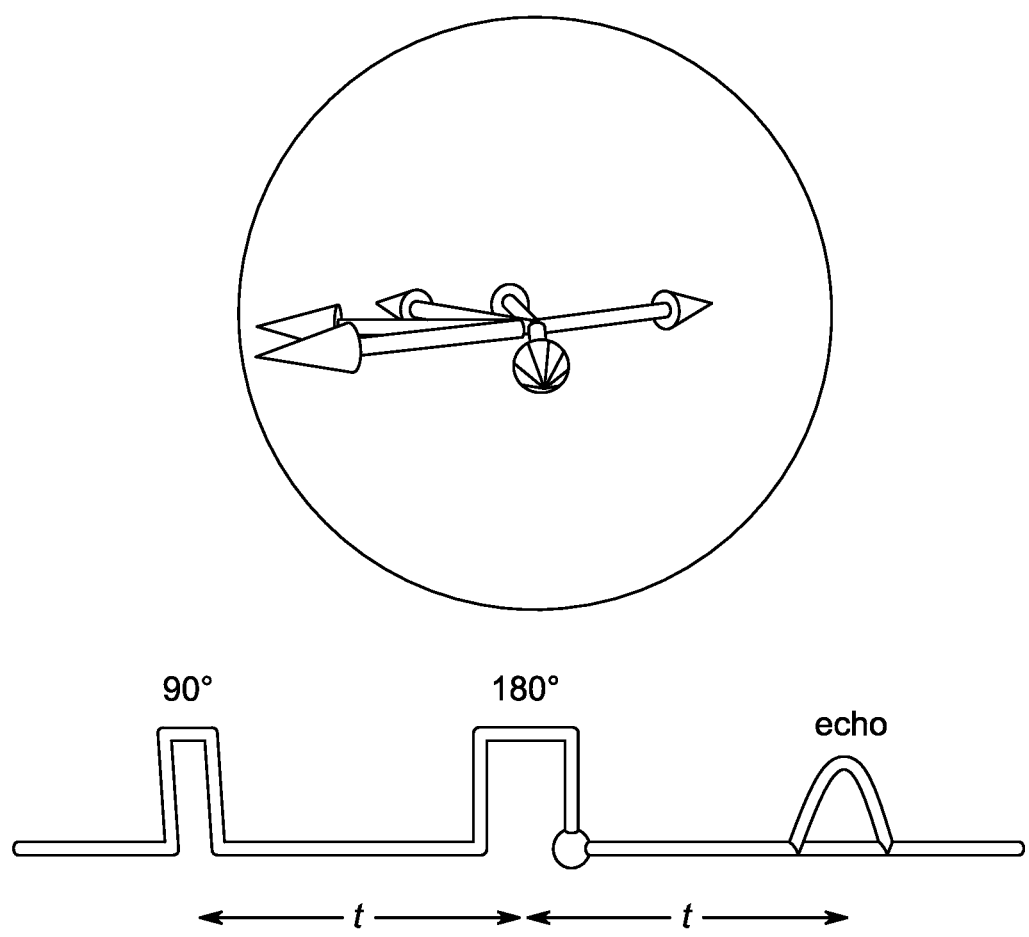
FIG. 4D. After RF irradiation from the opposite direction the former invisible elements (in 4C) become leading, face the detector coil and produce a signal. The former visible elements become lagging and are invisible.
Figure 4E:
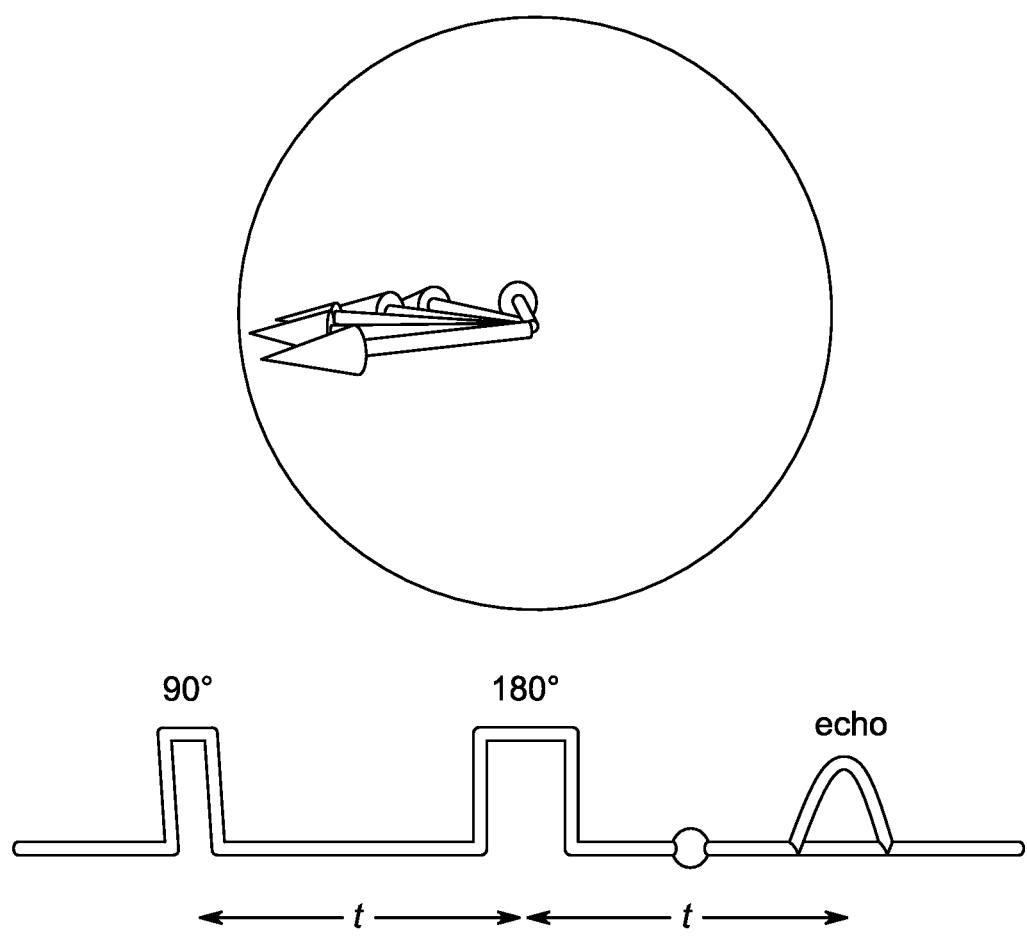
FIG. 4E. From the initial 90 degree "flip" of FIGS. 4B and 4C, the global vector first turns by 90 degrees vs. 4B and 4C (or 180 degrees vs 4A) and next additional 90 degrees, arriving at the arrangement as shown. After disconnection of RF energy, the individual magnetization vector continues synchronizing in the global transverse magnetization field M (as they do in $B_0$ in 4A), reaching a refocusing point later in time.
Figure 4F:
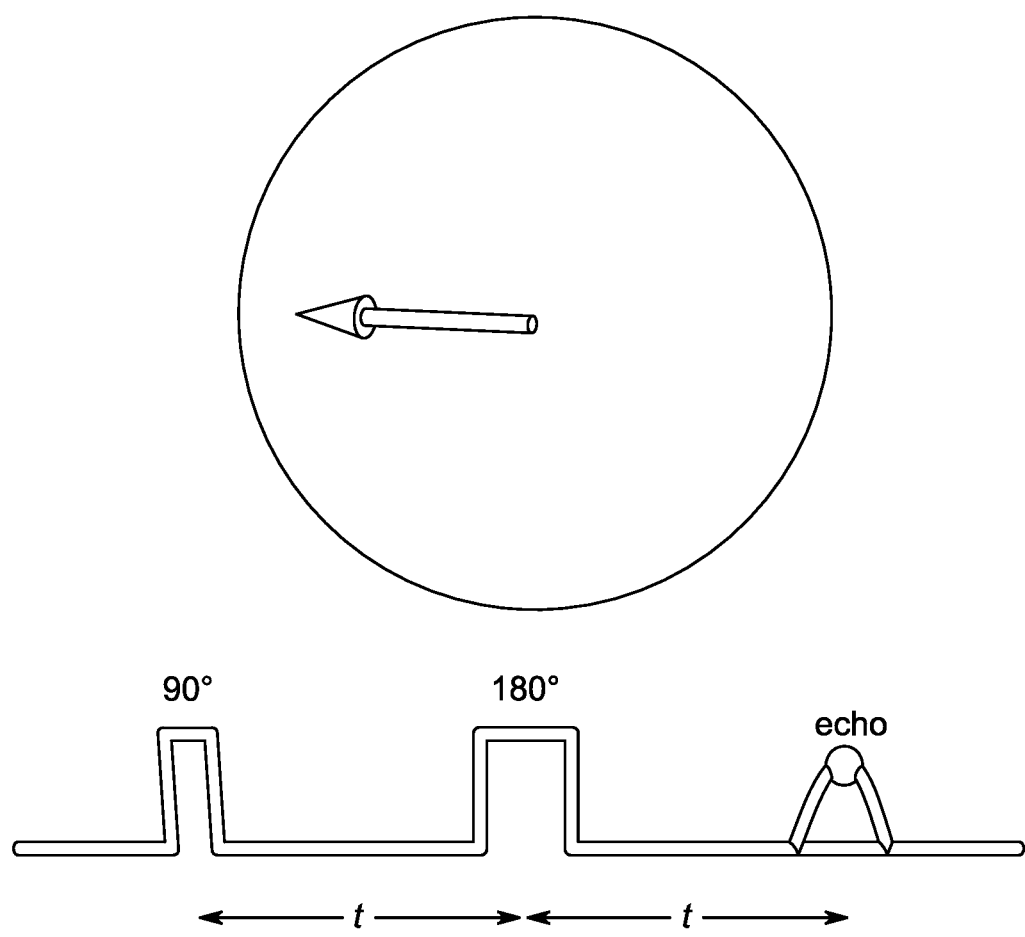
FIG. 4F. From the initial 90 degree "flip" of FIGS. 4B and 4C, the global vector first turns by 90 degrees vs, 4B and 4C (or 180 degrees vs 4A) and next additional 90 degrees, arriving at the arrangement as shown. The lagging elements continue to move in the transverse magnetic field M even when the RF energy is shut down, in the same sense as they converge in $B_0$ field in 4A. The field M acts more on the lagging elements and less on the leading elements, contributing to focusing of the signal in phase, observing "echo", even when RF is turned off.

FIG. 3 presents vector diagrams of the individual nuclei explaining acquisition of the 180 "flip angle" in the collective magnetization state. Such "flip" angles require twice as much energy absorbed by the sample from the RF pulse, due to either longer duration or higher intensity of the excitation pulsing. If in case of 90 degree "flip", the individual magnetization vectors are coherent and 50% are in the excited state (producing transverse orientation of the global vector, see FIG. 2), in case of 180 degree "flip" 100% of the individual nuclei are in the excited state. Upon reaching the exact 180 "flip", no transverse precession of the global magnetization vector takes place and the receiving RF coil detects no signal. Only after relaxation begins, the global magnetization vector begins to approach the 90 degree "flip" angle when the signal is maximized before it begins to decay. Simultaneously with the T1 relaxation, decoherence and T2 relaxation takes place all the way from the 180 degree "flip" to the final "flip" state (see below). The 180 degree regime produces more complex relaxation patterns and communicates qualitatively different information supplementing the lower degree regimes. In any real NMR experiment, however, the transverse magnetization decays much faster than would be predicted by natural atomic and molecular mechanisms; this rate is denoted T2* ("T2-star"). T2* can be considered an "observed" or "effective" T2, whereas the first T2 can be considered the "natural" or "true" T2 of the formation being imaged. T2* is always less than or equal to T2. T2* results principally from inhomogeneities in the main magnetic field. These inhomogeneities may be the result of intrinsic defects in the magnet itself or from susceptibility-induced field distortions produced by the formation or other materials placed within the field.

The 180 degree "flips" can be measured not only vs. the original up-field orientation of the magnetization vector but vs. the initial 90 degree "flip" in the sophisticated "spin echo" sequences of the present invention. FIG. 4A-F demonstrates such an interpretation of the 180 degree "flip".

Ideally, in each voxel of the apparatus space, all points should experience the same magnetic field and the same synchronized resonance conditions. However, inhomogeneity in the main magnetic field ("shimming"), local field shielding at some nuclei by valence electrons, and/or different kinetics of re-orientation, create a distribution of resonance frequencies. Some individual nuclei experience the spin "flip" earlier at lower delivered energy, some proceed together with the population average and some lag behind requiring a greater RF energy inputs to "flip". As a result, not all components participate in formation of NMR signal, since some "overshoot" the transverse spin orientation in the plane X0Y that is a prerequisite for signal detection, while the others remain in the original Z-axis aligned orientation. Thus, the information about the properties of these components remains unavailable, and the overall analysis becomes incomplete.

The application of saturating levels of RF energy leading to the 180 degree "flips" and "spin echo" phenomena addresses these problems (See Malcolm H. Levitt; Ray Freeman "NMR population inversion using a composite pulse". *Journal of Magnetic Resonance,* 1979, 33 (2): 473-476; Carr, H. Y.; Purcell, E. M. "Effects of Diffusion on Free Precession in Nuclear Magnetic Resonance Experiments". *Physical Review,* 1954, 94 (3): 630-638; Hahn, E. L. "Spin echoes". *Physical Review,* 1950, 80 (4): 580-594, incorporated herein by reference in their entireties). The sequence of vector diagrams illustrating the individual and collective magnetization is provided in FIGS. 4A-4F, representing still images from the animation of a Hahn echo. The red arrows can be thought of as the individual spins. Applying the first pulse rotates the spins by 90 degrees, producing an equal superposition of spin up and spin down (FIG. 2). The spins subsequently "spread out" because each is in a slightly different environment. This spreading out looks like decoherence, but it can be refocused by a second pulse which rotates the spins by 180 degrees. Several simplifications are used in this animation: no decoherence is included, and each spin experiences perfect pulses during which the environment provides no spreading. The individual spins continue focusing after disconnection of RF excitation because the surviving global transverse magnetization persists for several dozen or hundred milliseconds and the lagging individual elements experience the greatest focusing force, being perpendicular to the transverse magnetization vector M.

Both T1 and T2 relaxation mechanisms rely on the mobility of individual nuclei. The mobilities in the pores and in the bulk are unequal, with the more viscous boundary layers imposing faster T2 which dominate the overall relaxometric signature of the pores (the effects of the fluid in the bulk on the pore is negligible as compared to the effect of boundary layer). The interpretation as related to pore geometry is provided below.

Figure 5:
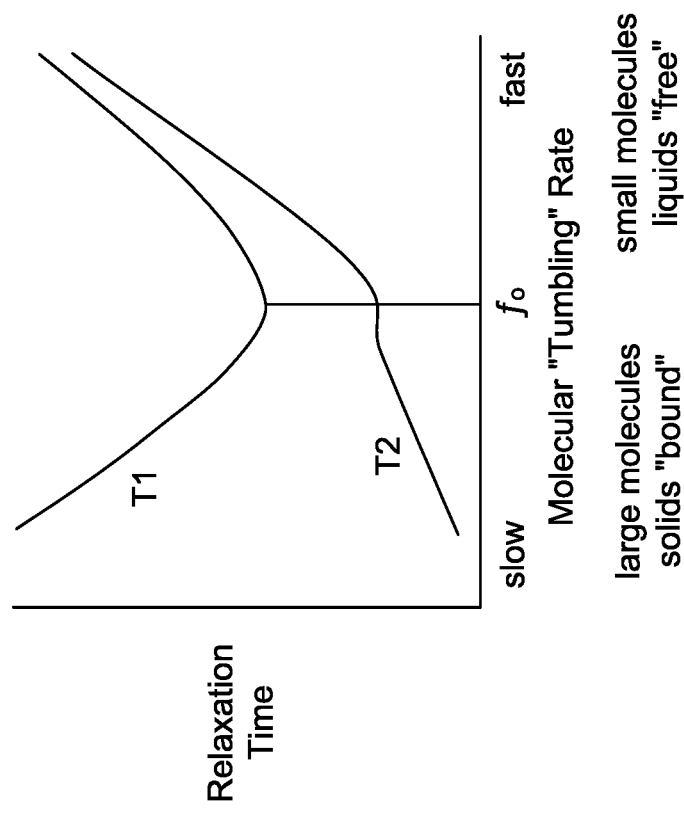
FIG. 5. Dependence of relaxation times T1 and T2 on the chemical nature, free vs. bound status and molecular weight of the molecules in the magnetized environment.

FIG. 5 presents a qualitative diagram and quantitative data comparing T1 and T2 relaxation times in different materials, as a function of the bound vs. free character of the protons and as a function of the molecular masses of each spin-bearing moiety. FIG. 5 illustrates that T1 and T2 are the longest for freely moving molecules of smaller mass, but T1 passes through a minimum and begins to increase again for macromolecules, polymers and nanoparticles. T2 is always shorter than T1 and is especially short for solid-phase or bound species, also demonstrating a much broader dynamic range, thus indicating why T2 is the parameters of choice for assessing the condition of hydrocarbon-bearing formation activated by aqueous acidic emulsion. Both T1 and T2 are shorter for hydrocarbons vs. free water.

Rationalizing of these trends is possible recalling that the detected NMR signal is produced by an ensemble of the flipped spin precessions, rotating in the transverse X0Y plane in the same phase (a necessary simplification). This assembly stores the energy absorbed from the RF pulse in the two major forms: (a) decreased entropy component by maintaining phase coherence and (b) orientation of the magnetic momenta perpendicularly to the acting base field $B_0$. This accumulated excessive potential energy of the ensemble is transferred to the environment, and the efficiency of energy transfer determines the duration of the relaxation period.

The precession movements represent a form of oscillations, and if the elements of the environment also oscillate with the same natural frequency as the precession frequency, the energy transfer becomes very efficient, by the same reason as NMR excitation becoming efficient when the external RF energy has the same period of oscillations. In case of relaxation, it is the oriented molecule in the collective magnetic field that plays the role of the external source and the molecules of the environment may or may not provide resonance absorbance, rapidly depleting the excessive energy of the ensemble. In free water, the own natural frequency ("tumbling rate", rotational degrees of freedom) exceeds the typical Larmor precession frequencies by orders of magnitude. Thus, the energy transfer is ineffective, and the relaxation times can be 3-5 seconds long for both T1 and T2. Hydrocarbons represent heavier molecules than water with slower "tumbling rate" producing more efficient energy transfer and dissipation for both T1 and T2. Polymers are too slow, and once they acquire transverse magnetization, the passage of energy becomes inefficient due to the "tumbling rate" (own oscillation frequency) of the entire molecules becoming much slower than the precession rate of the nuclei within them. Thus, T1 increases. Due to a very larger number of degrees of freedom, maintaining precession phase coherence in large molecules requires a very large entropy constraint which is not a probable state. Thus, the magnetizations in these particles decohere rapidly even if the entire molecules do not re-orient rapidly along Z-axis, leading to the shortened T2 at longer T1. In ice, re-orientation of the magnetization vector in parallel to Z axis is hindered by the participation of the water molecules in close order crystal structure, leading to the "tumbling rates" much slower than the nuclear precession frequency and therefore high T1. An ice crystallite can be considered as a polymer-like structure in which maintaining magnetization phase coherence would require large entropy constrain and therefore decohering is energetically favorable, producing short T2 and long T1.

Thus, NMR measurements are sensitive to the mobility of species, to the number of individual species, to the extent of participation in large structures, free or bound character, freely migrating or covalently bound hydrogen status. Sensitivity of NMR to so many parameters (see below) requires development of back-up alternatives. The Measuring While Drilling (MWD) alternatives to sample extraction, delivery to a laboratory and application of the results to the process upon completion of the laboratory study are advantageous (See Prammer, M. G., Drack, E., Goodman, G. et al. The Magnetic-Resonance While-Drilling Tool: Theory and Operation. *SPE Res Eval & Eng*, 2001, 4 (4): 270-275. SPE-72495-PA; Appel, M., Radcliffe, N.J., Aadireddy, P. et al. Nuclear Magnetic Resonance While Drilling in the U.K. Southern North Sea. Presented at the *SPE Annual Technical Conference and Exhibition*, San Antonio, Tex., USA, 2002, 29 September-2 October. SPE-77395-PA; Morley, J., Heidler, R., Horkowitz, J. et al. Field Testing of a New Nuclear Magnetic Resonance Logging-While-Drilling Tool. *Presented at the SPE Annual Technical Conference and Exhibition*, San Antonio, Tex., USA, 2002, 29 September-2 October. SPE-77477-MS; Poitzsch, M., Scheibal, J. R., Hashem, M. et al. Applications of a New Magnetic Resonance Logging-While-Drilling Tool in a Gulf of Mexico Deepwater Development Project. *Presented at the SPWLA 43rd Annual Logging Symposium*, Oiso, Japan, 2002, 2-5 June. SPWLA-2002-EEE; Heidler, R., Morriss, C., and Hoshun, R. 2003. Design and Implementation of a New Magnetic Resonance Tool for the While Drilling Environment. *Presented at the SPWLA 44th Annual Logging Symposium*, Galveston, Tex., USA, 2002, 22-25 June. SPWLA-2003-BBB; Borghi, M., Porrera, F., Lyne, A. et al. Magnetic Resonance While Drilling Streamlines Reservoir Evaluation. *Presented at the SPWLA 46th Annual Logging Symposium*, New Orleans, 2005, 26-29 June. Paper 2005-HHH).

In one embodiment, the method relies on the commercially available drilling assemblies incorporating NMR apparatus among other sensors for providing the real-time multifactorial feedback. Non-limiting examples include Pro-Vision Plus (magnetic resonance while drilling apparatus by Schlumberger). The apparatus and the software acquires the T2 data derived from pore size and fluid properties within several seconds, the T2 data can be further processed to quantify bound- and free-fluid volume and capillary-bound water. MR signal decay data helps ascertain permeability, producible porosity, and irreducible water saturation as well as capillary pressure curves, hydrocarbon identification, and facies analysis. A real-time permeability log enables predicting production rates to optimize completion and stimulation programs.

Analogously, Halliburton Sperry Drilling apparatus and software offers logging-while-drilling (LWD) nuclear magnetic resonance (NMR) source-less porosity solutions to help gain insight into the key petrophysical properties of the reservoir through a mineralogy-independent porosity assessment. The apparatus (MRIL®-WD™ Magnetic Resonance Imaging Logging-While-Drilling Sensor) determine the total porosity of a reservoir, movable fluid volume, capillary bound fluid volume, and micro-porosity—essential information to allow a user to determine which fluids produce hydrocarbons upon stimulation. By calculating a qualitative estimate of permeability, the user identifies which reservoir intervals have greater flow, and can better target the optimal spots for increased production.

Other providers of the small-diameter borehole-adapted NMR apparatuses comprise Mount Sopris Instruments, Baker Hughes Incorporated tools, Dart, Javelin, and Javelin Wireline tools by VISTA-CLARA INC without limitation. These and the additional MRWD (magnetic resonance while drilling) designs are disclosed in U.S. Ser. No. 10/197,698, U.S. Ser. No. 10/401,313, U.S. Ser. No. 10/473,600, U.S. Ser. No. 10/295,627, U.S. Ser. No. 10/338,267, US20190033483, U.S. Ser. No. 10/191,178 incorporated herein by reference in entirety.

In a preferred embodiment, the commercial, experimental and customized downhole NMR apparatuses can support diffusion NMR and can produce the magnetic gradient pulses. Diffusion NMR methods resolve different compounds spectroscopically in a mixture based on their differing diffusion coefficients, depending on the size and shape of the molecules. Diffusion NMR may be used to resolve otherwise intractable spectra of mixtures, or it may be used to determine the size of molecules and aggregates, determining the degree of polymerization, size of a solvation shell or other microscopic structure. The spectra produced resemble chromatograms is some respects while also providing NMR information that can be used for the assignment of individual components.

Figure 6A:
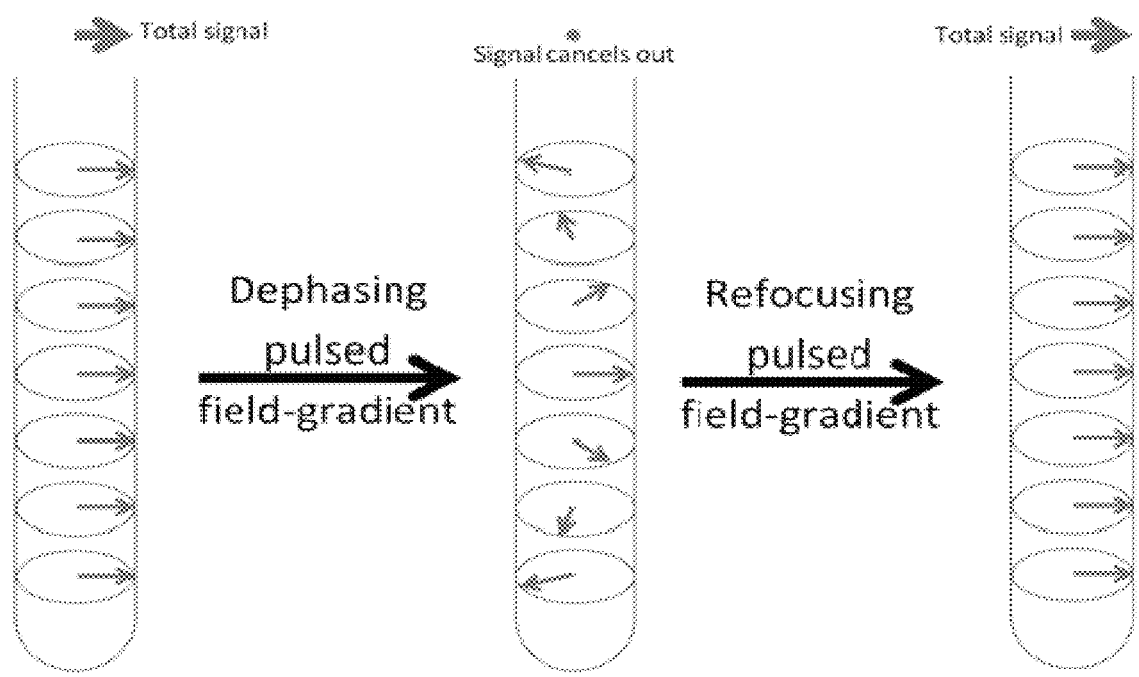
FIG. 6A: General scheme of PGSE (pulse field gradient echo) for measuring molecular diffusion.
Figure 6B:
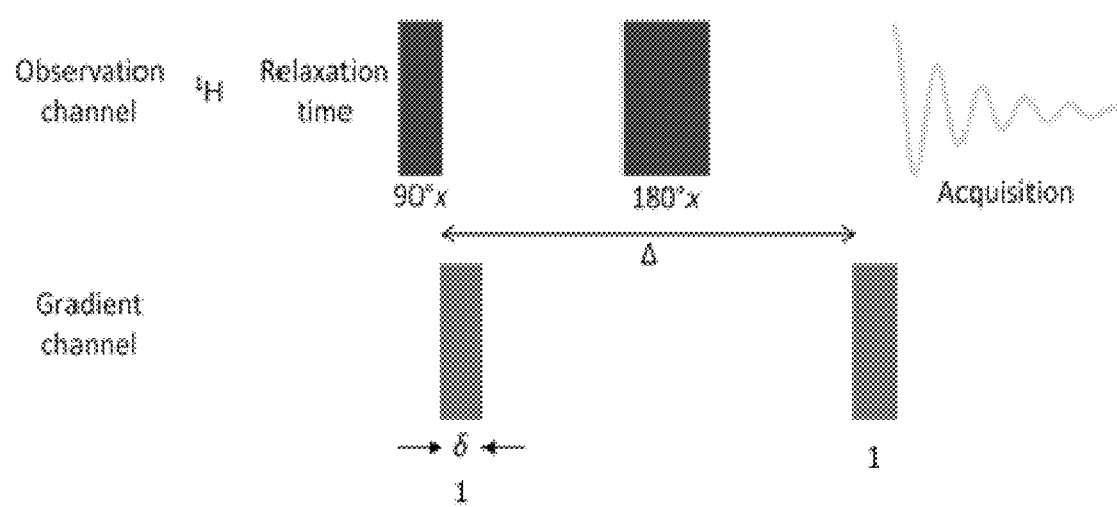
FIG. 6B: The relation of RF and magnetic gradient pulses in the diffusional measurements.
Figure 6C:
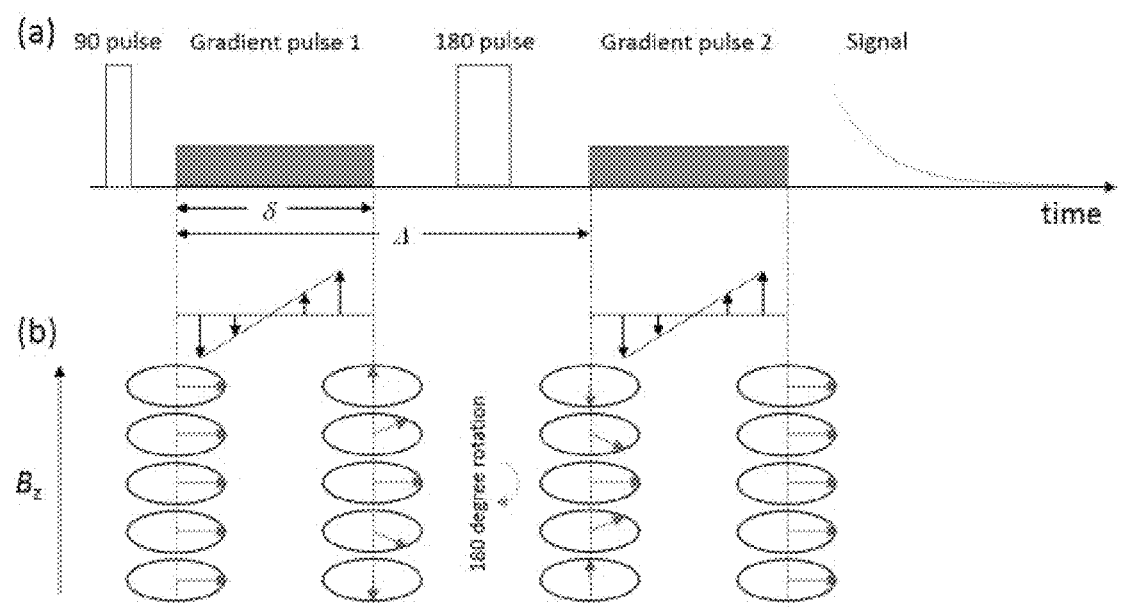
FIG. 6C: Development of decoherence and the subsequent re-focusing in the nuclei assembly as a function of RF pulses (hollow rectangular vertical bars) and magnetic gradient pulses (blue rectangular horizontal bars).

FIGS. 6A-D illustrate the principles of diffusion NMR with a magnetic pulse gradient. As shown in FIG. 6A, the magnetization vector is already 90 degrees "flipped" by the RF pulse, producing a detectable signal in the transverse detector coil. The precession movement of the nuclei is synchronized in the resonance transition. The term "dephasing pulse-field gradient" refers to the gradient of the magnetic field generated by the gradient magnetic coils (FIG. 1), to be differentiated from the RF pulse generated by RF coils. Imposition of different B values in the analyzed volume by the magnetic gradient pulse leads to different precession frequencies and therefore decoheres the initial magnetized environment post 90 degree "flip". No signal can be detected, since the global magnetization vector becomes zero. "Refocusing pulse field gradient" re-orients the nuclei that were in phase after the 90 degree "flip" and restores the signal in the detector, however, the diffusion of the species out of the volume that communicates with the detector coil diminishes the restored signal. Thus, the difference between signals before and after the sequence cycle provides the basis for estimating the diffusion coefficients. FIG. 6B illustrates the refocusing aspect. After a period of Δ/2 a 180° radiofrequency pulse inverts the dispersed magnetization such that after a period of Δ the magnetization is the negative of what it was following the gradient pulse. At this point, a second gradient pulse is applied to refocus the signal. The refocusing develops due to two contributions: one is the 180 degree "flip" counted vs. the initial 90 degree "flip" as typical in echo sequences and accomplished by an RF pulse (blue upper signals in FIG. 6B). The magnetization focusing by this mechanism was disclosed above. The second mechanism is the reversal of the magnetic pulse (the second pulse of the magnetic gradient), shown in red in FIG. 6B. The phase diagram in FIG. 6C illustrates the interaction between the 180-degree RF pulse and the second magnetic gradient pulse. The FIG. 6C clarifies that the individual magnetic momenta of the nuclei that lag behind the neighbors or overtake them in terms of precession movement return to the previous position after the 180 degree RF and the second magnetic gradient pulse (inverted vs. the first gradient pulse), restoring the coherence and allowing to observe the signal. The PGSE sequence leads to identification and diffusion coefficient measurement for the diverse species.

In PGSE in the case of self-diffusion of molecules, the normalized signal amplitude E/E0 decays as a Gaussian curve with increasing magnetic gradient pulse amplitude G:

$$\frac{S(TE)}{S_0} = \exp\left[-\gamma^2 G^2 \delta^2 \left(\Delta - \frac{\delta}{3}\right) D\right] \quad (13)$$

where $S_0$ is the signal intensity without the diffusion weighting, S (TE) is the signal with the magnetic field gradient, $\gamma$ is the gyromagnetic ratio, G is the strength of the gradient pulse, $\delta$ is the duration of the pulse, $\Delta$ is the time between the two pulses, and finally, D is the diffusion coefficient.

Figure 6D:
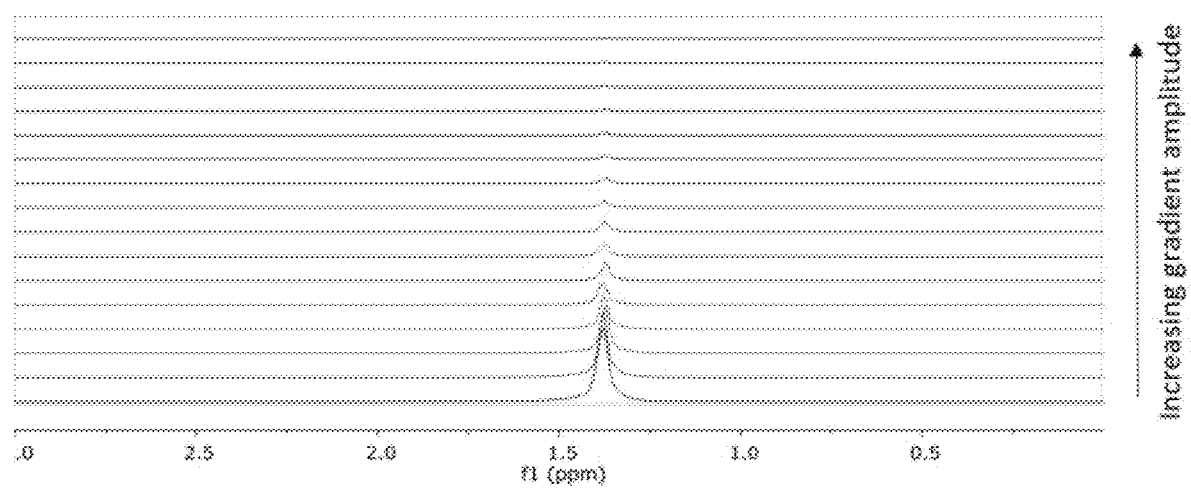
FIG. 6D: Accumulation of data points in the diffusion measurements by NMR.

FIG. 6D shows a stacked experiment, where the strength of the residual signal S(TE) is plotted as a function of the magnetic field gradient G. The FIG. 6D illustrates how the resonance signal emerges at the resonance RF frequency f1 and how the signal decreases in the serial measurements as a function of dephasing magnetic gradient pulse.

In a preferred embodiment, the apparatus and software support partial flip angles with more rapid accumulation of multiple data points to produce logarithmic plots. The plots are linear in the coordinates [ln S(TE)/S0=k G$^2$] where the coefficient k includes the diffusion coefficient and the cycle pulse parameters. The rate of data point accumulation is important to increase the signal-to-noise ratio, which may be high in the NMR method of diffusion measurement due to high propagated error. In this embodiment, the partial flip angles range from 10 to 85 degrees without reaching the 90 degrees, which is achievable by softer RF pulses. The increased rate of data acquisition is achievable under these conditions due to shorter periods of magnetization energy accumulation and relaxation. In addition, partial flip angles alleviate the limitations on sensitivity that arise from the quantum-mechanical nature of the phenomenon. For quantum states separated by energy equivalent to radio frequencies, thermal energy from the environment causes the populations of the states to be close to equal. Since incoming radiation is equally likely to cause stimulated emission (a transition from the upper to the lower state) as absorption, the NMR effect depends on an excess of nuclei in the lower states. Several factors can reduce sensitivity, including increasing temperature, which evens out the population of states.

Conversely, low-temperature NMR can sometimes yield better results than room-temperature NMR, providing the sample remains liquid. Saturation of the sample with energy applied at the resonant radiofrequency (complete flip angles, 90 degrees or above) is another sensitivity-reducing factor. This manifests in both constant wave (CW) and pulsed NMR. In the first case (CW) this happens by using too much continuous power that keeps the upper spin levels completely populated. In the second case (pulsed), each pulse (that is at least a 90° pulse) leaves the sample saturated, and four to five times the (longitudinal) relaxation time (5T1) must pass before the next pulse or pulse sequence can be applied. For single pulse experiments, shorter RF pulses that tip the magnetization by less than 90° can be used, which loses some intensity of the signal, but allows for shorter recycle delays. The optimum "flip" angle is called an Ernst angle. The relaxation times for the protons in free water are relatively short, but in the drilling conditions, nanoparticles and hydrocarbon-based aggregates contribute slowly relaxing components, and the use of partial angles can be advantageous.

Figure 7:
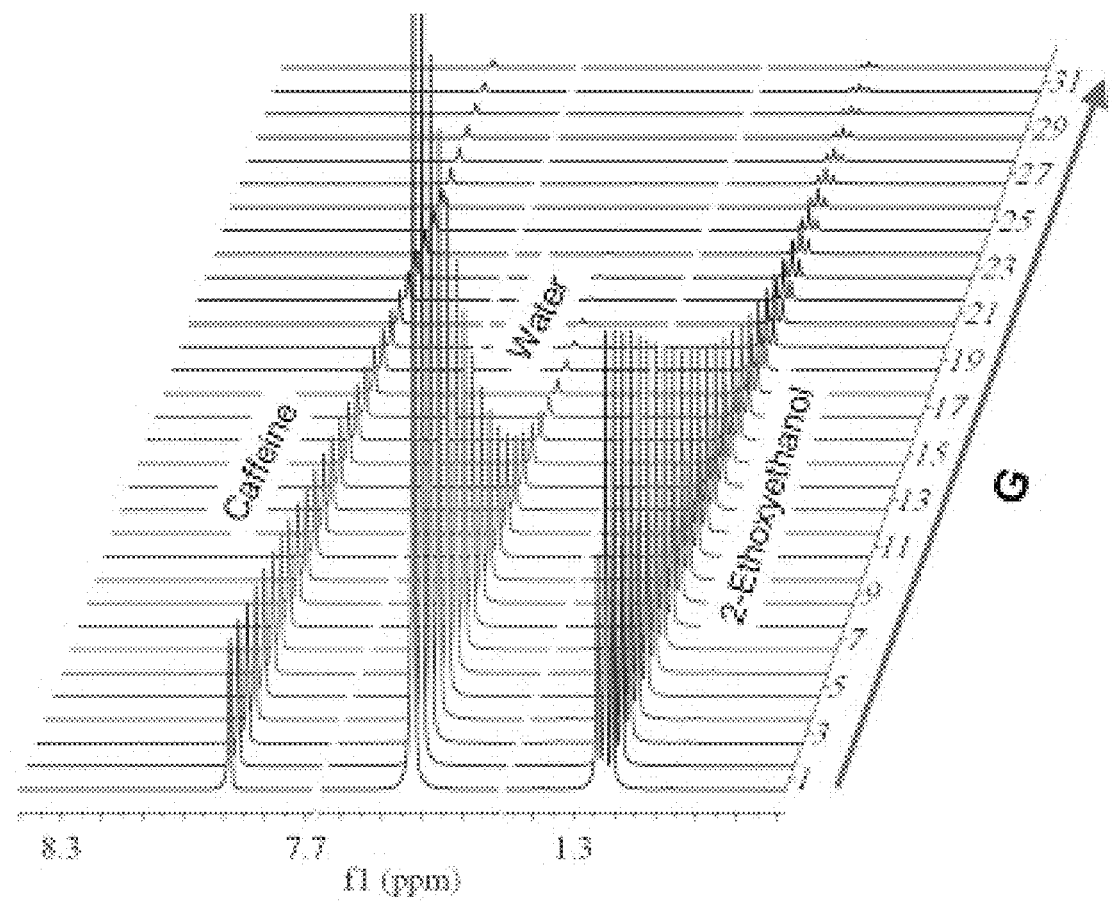
FIG. 7: Diffusion ordering spectroscopy NMR (general scheme).
Figure 8A:
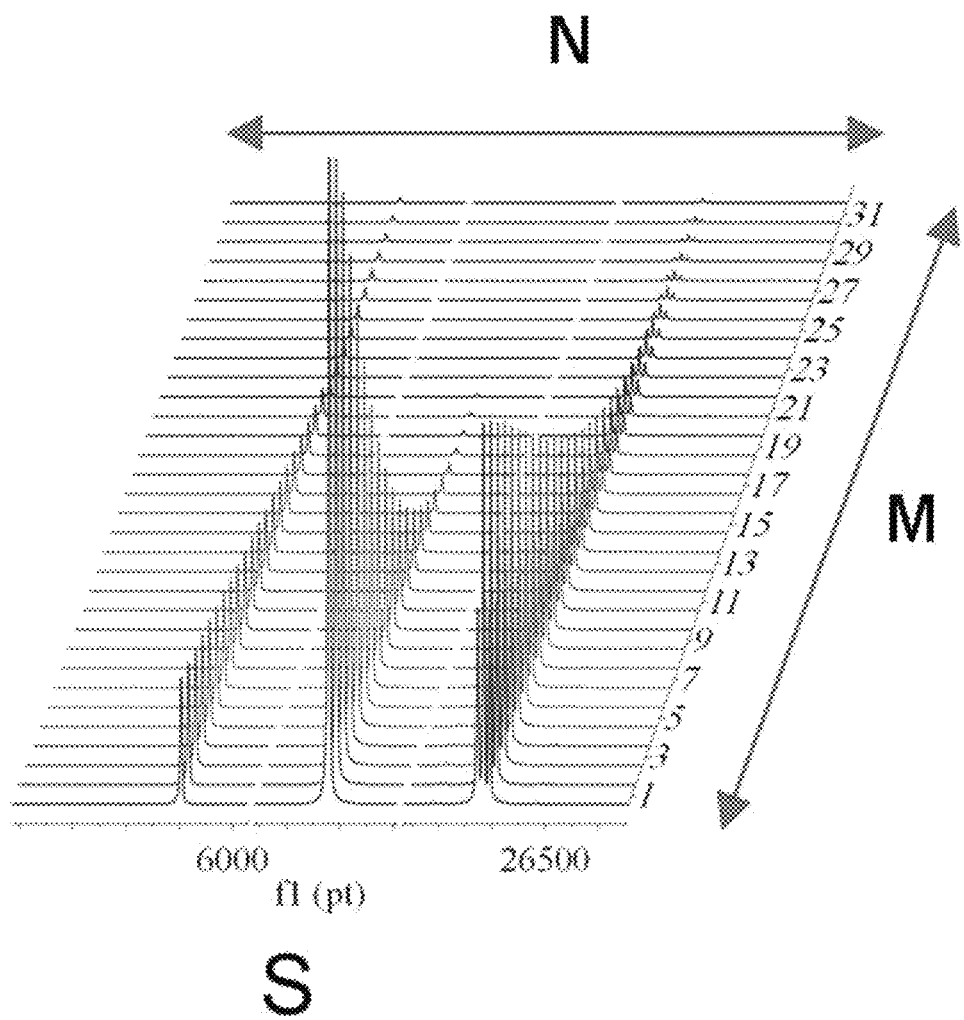
FIG. 8A: Transformation of the f1-G data into DOSY data. The primary data: the axis S corresponds to the chemical shifts, the axis M corresponds to the intensity of magnetic pulse gradient. Different species show different rate of extinction.
Figure 8B:
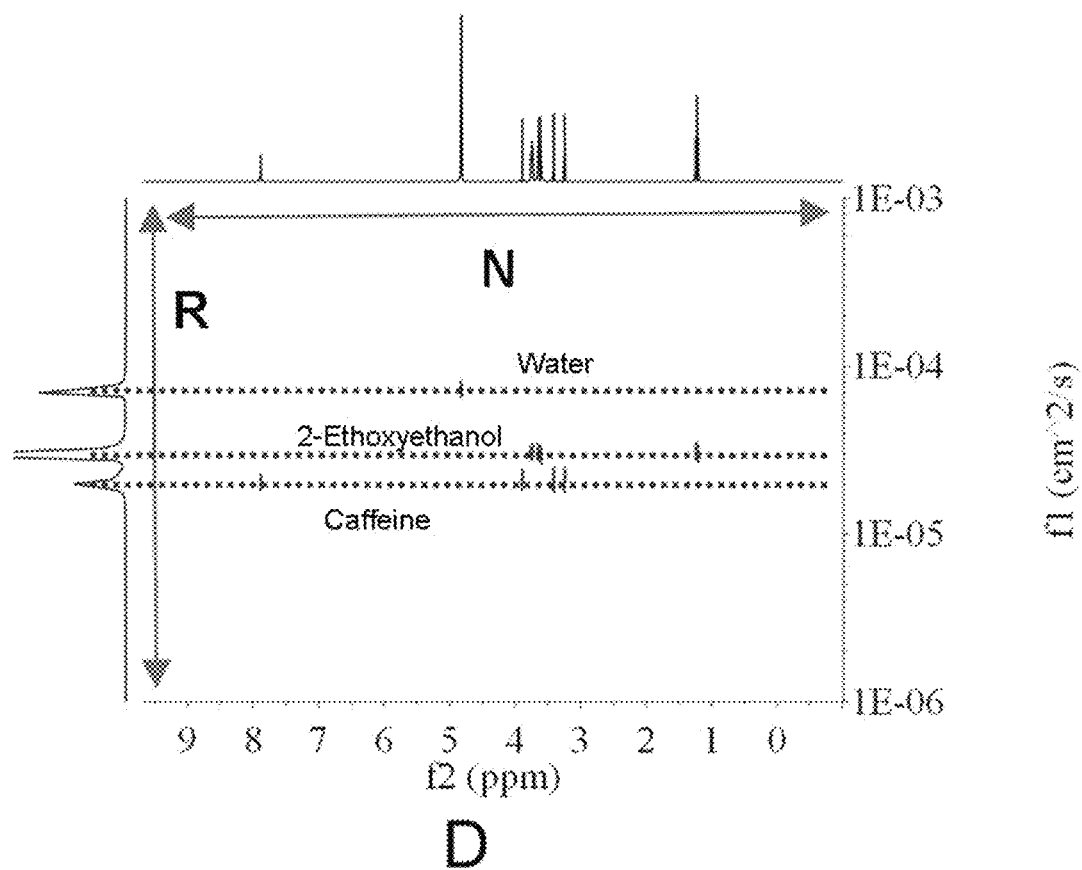
FIG. 8B: Transformation of the f1-G data into DOSY data. The data 8A are reorganized. The axis D corresponds to the chemical shifts, the axis f1 corresponds to the intensity of magnetic pulse gradient.

In another preferred embodiment, multiple diffusion coefficients are simultaneously measured in combination by pulsed NMR, with the device and software supportive of data generation and analysis. FIG. 7 presents Diffusion-Ordering Spectroscopy NMR (DOSY). The figure presents a 2D plot with the abscissa being the chemical shifts and the ordinate being the magnitude of the magnetic gradient (See equation 13). The chemical species are identified by the shifts, and the decay of the signal is a function of magnetic gradient pulse strength G is plotted for each chemical shift. As far as data processing of raw PFG-NMR spectra is concerned, the goal is to transform the N×M data matrix S into an N×R matrix (2D DOSY spectrum) as shown in FIGS. 8A and 8B. The horizontal axis of the DOSY map D is identical to that of S and encodes the chemical shift of the nucleus observed (generally 1H). The vertical dimension, however, encodes the diffusion coefficient D. In the ideal case of non-overlapping component lines and no chemical exchange, the 2D peaks align themselves along horizontal lines, each corresponding to one sample component (molecule). The horizontal cut along such a line should show that the component's 'normal' spectrum of chemical shifts. Vertical cuts show the diffusion peaks at positions defining the corresponding diffusion constants. The mapping S=>D is called the DOSY transformation. This transformation is, unfortunately, far from straightforward. Practical implementations of the procedure include mono and biexponential fitting, Maximum Entropy, and multivariate methods such as DECRA 'Speedy Component Resolution' (See M. Nilsson and Gareth A. Morris in *Anal. Chem.*, 2008, 80, 3777-3782 incorporated herein by reference in entirety) as an improved variation of the Component Resolved (CORE) method (*J. Phys. Chem*, 1996, 100, 8180, incorporated herein by reference) providing a multivariate-based that shows an advantageous performance of the algorithm.

Figure 9:
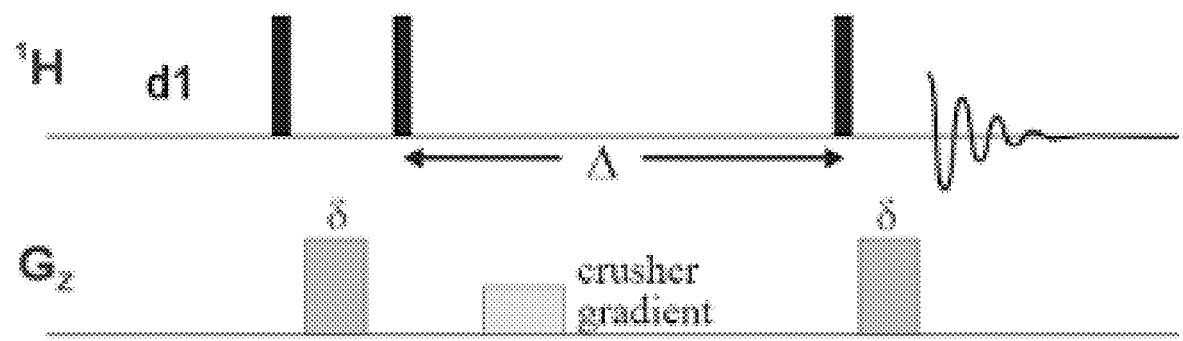
FIG. 9: A scheme of stimulated echo sequence (STE) NMR experiment.
Figure 10:
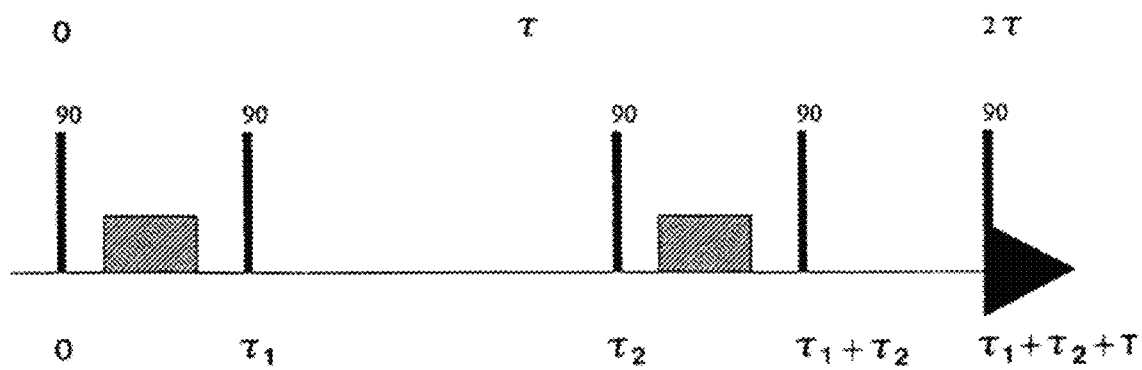
FIG. 10: A scheme of longitudinal encode-decode or "longitudinal eddy current delay" echo sequence NMR experiment.
Figure 11:
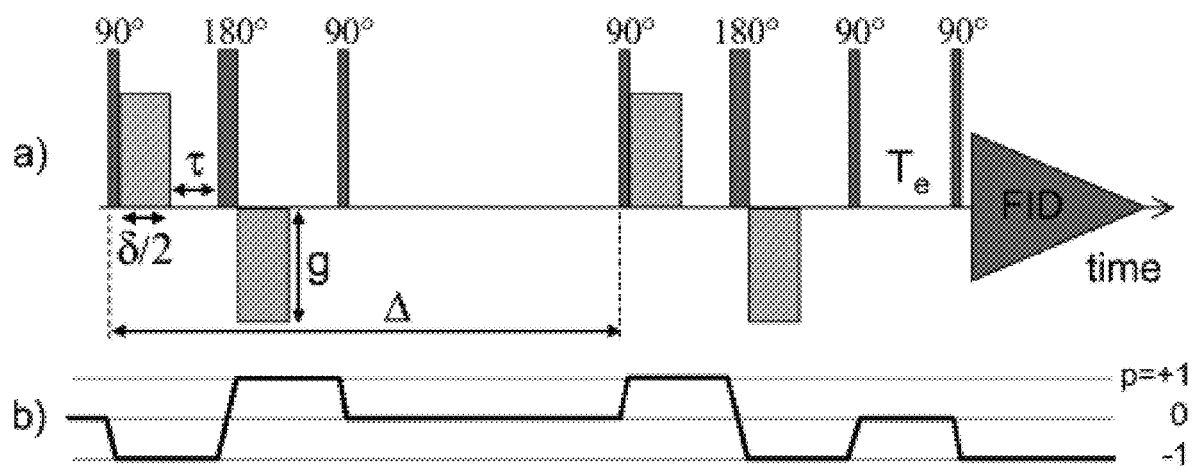
FIG. 11: Bipolar gradient longitudinal encode-decode BPP-LED pulse sequence NMR experiment.
Figure 12:
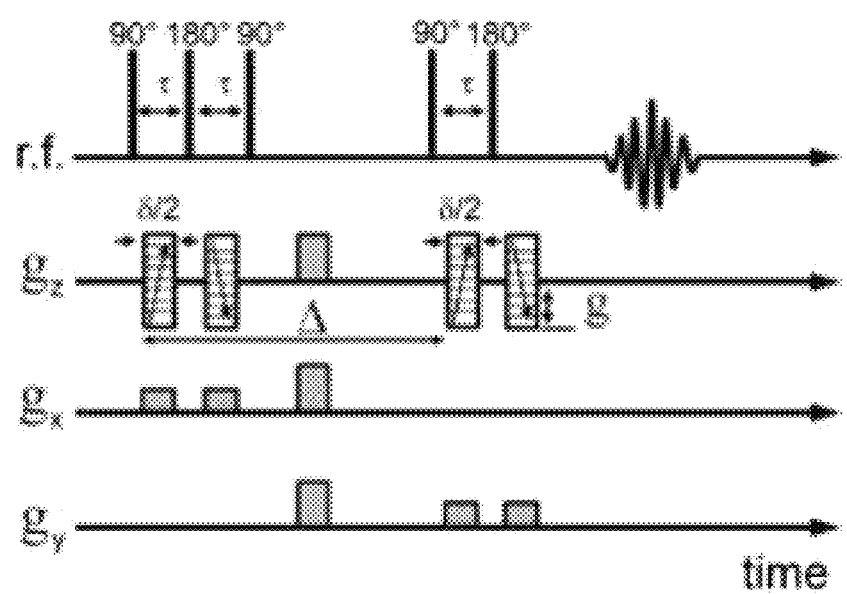
FIG. 12: Alternating Pulsed Field Gradient Stimulated Echo Nuclear Magnetic Resonance (APGSTE) sequence.

In another preferred embodiment, the apparatus and software support the additional sequences suitable for the diffusion coefficient measurements: the Hahn stimulated echo (STE) with pulsed field gradients (FIG. 9). The sequence is analogous to PGSE but differs by providing two 90 degrees RF pulses in place of one 180-degree RF pulse in PGSE and by insertion of an additional "crusher" magnetic gradient pulse step. The LED (longitudinal encode decode) pulse sequence used in the NMR diffusion experiments is shown in FIG. 10. The radiofrequency pulses are shown as filled vertical rectangles with the flip angles denoted above each pulse. The magnetic field gradient pulses are shown as hatched rectangles, and the data acquisition is indicated with a vertically hatched triangle. Bipolar gradient longitudinal encode-decode pulse sequence (BPP-LED) is shown in FIG. 11. The BPPLED method cancels the adverse effects of eddy currents using two gradient pulses with identical areas but different polarities. Other embodiments comprise, respectively, the gradient compensated stimulated spin-echo pulse sequences (GCSTE), the double stimulated echo sequence (DSTE), the STE-INEPT pulse sequences for heteronuclear detected DOSY with coherence transfer, shuttle based fringe field 2D-DOSY, and the Alternating Pulsed Field Gradient Stimulated Echo Nuclear Magnetic Resonance (APGSTE) sequence (FIG. 12) without limiting. The APGSTE sequence is especially preferred for analyzing anisotropic diffusional systems, such as hydrocarbon-bearing formations with anisotropic porosity and tortuosity distributions. The sequence comprises focusing and de-coherence by the series of magnetic gradient pulses in 3 dimensions, explaining its unique suitability for more realistic modelling of diffusional coefficient tensors. All sequences lead to processing and data collection/transform by the DOSY methodology, with the Tanner and Stejskal equation modified for each specific sequence (See Jan Hrabe, Gurjinder Kaur, and David N. Guilfoyle, "Principles and limitations of NMR diffusion measurements" in *J Med Phys.*, 2007 January-March; 32(1): 34-42; Davy Sinnaeve, "The Stejskal-Tanner Equation Generalized for Any Gradient Shape—An Overview of Most Pulse Sequences Measuring Free Diffusion" in *Concepts in Magnetic Resonance Part A,* 2012, Vol. 40A(2) 39-65, incorporated herein by reference in entirety).

In the most preferred embodiments, the in-situ "logging-as-drilling" NMR data are applied to the calculation or estimation of porosity by utilizing relaxation times and tortuosity by utilizing measured restricted diffusion.

The physical basis for using restricted diffusion for assessing pore geometry results from the following: diffusion coefficient measures the number of elementary "leaps" between local potential energy minima. This number of "leaps" needs to increase to carry a labeled particle to the target destination, if the trajectory is tortuous as compared to a control where the trajectory is linear. The spin precession coherence in pulsed NMR measurements is a variant of labeling (FIG. 6C). The distance the spin-labeled particle can escape from the previous position is proportional to time-dependent loss of NMR signal (see the discussion of FIGS. 6 and 7) and forms the basis for diffusion coefficient measurement. In a tortuous environment this distance is reduced because more elementary leaps are required to accomplish the same displacement, or for the same period of NMR sequence time—a lesser displacement is achieved per the same number of elementary leaps. The differences between restricted and bulk diffusion develop as a function of time. Over shorter time intervals, the number of elementary leaps outside the pores and in the pore environments is comparable. However, over a longer interval, the diffusing particle experiences collisions with the pore walls, while the motion outside the pores is unhindered, increasing the ratio. The real effect of diffusional restriction needs to be observed in the asymptotic range of this time-dependence, forcing certain minimal lengths of the NMR sequence duration (See FIGS. 14-17 in the Examples).

This time-dependence of the restricted diffusion ratios is variable for the pores of different radii and can be used to evaluate pore size distribution, together with the T2 relaxation data considered below. Both methods are based on different physical principles and thus represent the independent predictors of other economically important properties, such as rock permeability, wettability and mechanical strength. The time-dependence of restricted diffusion can be also anisotropic to a variable degree in different brackets of pore sizes.

Another complexity is the heterogeneity of the flow through the pores. The assumption is that the formation is flooded and that the diffusing 1H nuclei belong to water. Only when the 1H nuclei outside of the pores and within the pores demonstrate comparable inherent mobility (frequency and length of the elementary leaps), the observed differences are attributable to restriction alone. The water may be diffusion-restricted (from the NMR viewpoint) not only by the geometry of the pores but by forming microemulsions in the hydrocarbon flow or being bound on the pore surfaces. The anisotropy conclusion needs to be verified comparing different fractions of the NMR signal in terms of relaxation times and chemical shifts. For example, the pore anisotropy conclusion reached using water chemical shifts should agree with the conclusions reached using hydrocarbon chemical shifts. Typically, in a flooded well there is enough water saturation in the pores that can be filtered by relaxation times and chemical shifts, matching that in the bulk water outside of the porous media. Thus, the assumption is that the 1H NMR studies water and the primary data are filtered for the non-emulsified pore-dwelling water contributions. Mud fluids used to cool the rigs and remove the drilling cuttings ensure that the proximal surface 0-5 mm deep into the borehole wall satisfies the criteria above.

Tortuosity has different definitions depending on the method of measurement (B. Ghanbarian, A, G. Hunt, R. P. Ewing, and M. Sahimi, "Tortuosity in Porous Media: A Critical Review," Soil Sci. Soc. Am. J., vol. 77, no. 5, p. 1461, 2013—incorporated herein by reference in its entirety). The definition of this disclosure is "diffusive tortuosity, $\tau_d$," which is defined as the ratio of the free self-diffusion coefficient of bulk fluid, $D_0$, to the restricted diffusion coefficient of fluid in the porous media, $D_R$:

$$\tau_d = D_0/D_R \tag{14}$$

One of the most accurate non-invasive techniques to measure diffusion coefficients in porous media is NMR pulsed field gradient (NMR PFG, see FIGS. 4-12 and discussion herein). Recent studies (See K. Yang et al., "Quantitative Tortuosity Measurements of Carbonate Rocks Using Pulsed Field Gradient NMR," Transp. Porous Media, September 2019, incorporated herein by reference in entirety) showed that NMR PFG can be utilized to measure Td in porous rocks since such parameter is essential for enhanced gas recovery studies. The magnetic field gradient in NMR PFG can be applied in different directions, and therefore anisotropy in diffusion coefficient can be evaluated. Based on this concept, NMR PGF is used in the field of physical chemistry and material sciences to evaluate diffusion anisotropy in plant tissues, liquid crystals and battery electrodes (S. Engelke, L. E. Marbella, N. M. Trease, M. De Voider, and C. P. Grey, "Three-dimensional pulsed field gradient NMR measurements of self-diffusion in anisotropic materials for energy storage applications," Phys. Chem. Chem. Phys., vol. 21, no. 8, pp. 4538-4546, January 2019, Y. Qiao, P. Galvosas, and P. T. Callaghan, "Diffusion Correlation NMR Spectroscopic Study of Anisotropic Diffusion of Water in Plant Tissues," Biophys. J., vol. 89, no. 4, pp. 2899-2905, October 2005, I. Furo and S. V. Dvinskikh, "NMR methods applied to anisotropic diffusion," Magn. Reson. Chem., vol. 40, no. 13, pp. S3—S14, December 2002).

Figure 13:
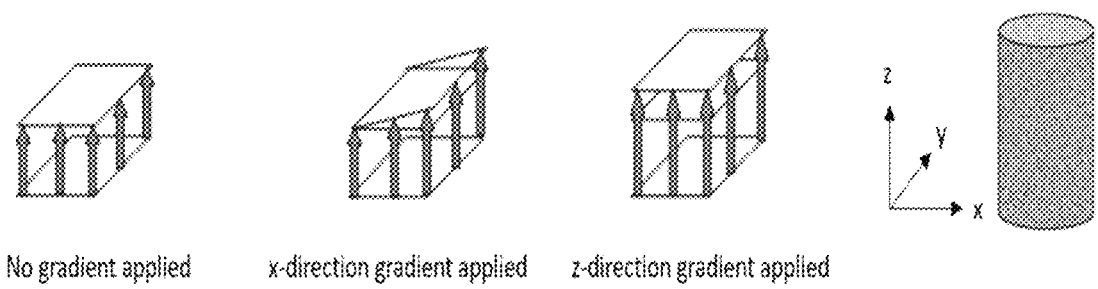
FIG. 13: Representation of the Application of NMR Pulse Field Gradient in Different Directions (modified after http://mri-q.com/gradient-coils.html).

In a preferred embodiment of the present disclosure, NMR PFG is used to evaluate permeability anisotropy in hydrocarbon-reservoir rock. Evaluating td in both vertical and horizontal directions (with respect to the layering direction) can quantitate the permeability anisotropy in hydrocarbon reservoirs and their later use for large-scale modeling of borehole productivity. FIG. 13 shows a representation of how the NMR gradient is utilized to measure the anisotropic characteristic of the rock samples. If the z-direction gradient is applied, the movement of the molecules is in the vertical direction of the sample, which gives an indication of the vertical permeability of the rock sample. On the other hand, if the x-direction gradient is applied the movement of the molecules is in the horizontal (radial) direction.

In a preferred embodiment, a stand-alone NMR methodology (no supporting methods) determines tortuosity, porosity, pore size distributions and anisotropy of tortuosity and porosity. The advantage of a stand-alone method is simplicity of the downhole sensor assembly relying on a single apparatus to collect the log data suitable for further machine learning processing. The stand-alone method is less reliable than a method utilizing multiple principles, but may be cheaper if applied in the same basin for the same mineralogical composition.

In a stand-alone NMR method, porosity is determined relaxometrically by deconvoluting the information produced at post-RF pulse stages in the magnetic gradient pulse sequences. FIGS. 9-12 all describe the intervals of time between the RF and magnetic pulses when the magnetized media relaxes via the T2 mechanism. Thus, two measurements—of restricted diffusion coefficients and of relaxation patterns—are performed by the analysis of a single sequence cycle. The reciprocal of relaxation time in a particular region is proportional to the magnetization energy dissipated by the region of interest (See Valfouskaya, A.; Adler, P. M.; Thovert, J. F.; Fleury, M. (2005), "Nuclear magnetic resonance diffusion with surface relaxation in porous media", Journal of Colloid and Interface Science, 295 (1): 188-201; Brownstein, K. R.; Tarr, C. E. (1979), "Importance of classical diffusion in NMR studies of water in biological cells", Physical Review A, 19 (6): 2446; incorporated herein by reference in entirety). The balance expression for one pore:

$$\frac{1}{T_i} = \left(1 - \frac{\delta S}{V}\right)\frac{1}{T_{ib}} + \frac{\delta S}{V}\frac{1}{T_{is}} + D\frac{(\gamma Gt_E)^2}{12} \quad (15)$$

Where:
 $\delta$ is the thickness of the surface area of the bound water on the pore's walls,
 S is the surface area of the pores,
 V is the pore volume,
 $T_{ib}$ is the relaxation time in the bulk volume,
 $T_{is}$ is the relaxation time for the surface,
 $\gamma$ is the gyromagnetic ratio,
 G is the magnetic field gradient (assumed to be constant),
 $t_E$ is the time between echoes and
 D is the self-diffusion coefficient of the fluid.

The amplitude of NMR signal is proportional to the number of 1H nuclei. In the samples with greater porosities, the strength of the signal is proportionally higher, and porosity fraction can be estimated measuring the signal from the porous material and bulk water. The bulk V of a pore exhibits a single exponential decay. The nuclei close to the pore wall surface S exhibits faster T2 than the bulk, due to higher viscosity ("ice-likeness") of the bound water. Since the pores are assumed to be unconnected and small, the diffusivity loss of energy and relaxation in the pore bulk are neglected.

With $T_{is} \ll T_{ib}$, the expression (15) transforms:

$$\frac{1}{T_2} = \frac{\rho S}{V} \quad (16)$$

$$M(t) = M_0 e^{-t/T_2} \quad (17)$$

Where:
 S/V is the surface to volume ratio of a single pore in the given direction,
 $\rho$ is the surface relaxation strength (the intensity of magnetization energy dissipation due to interaction with the surface-bound water),
 M(t), $M_0$ are, respectively, the current and the initial magnetization in the given pore. Considering the distribution of the pores, the expression becomes:

$$M(t) = M_0 \sum_{i=1}^{n} a_i e^{-t/T_2} \quad (18)$$

Where $a_i$ are the volume fractions of the pores with the surface to volume ratios (18), defining the values $T_2$. The M(t) values in (18) are grouped based on the pore radii and finite numbers of pore diameter categories fit the experimental time-dependent values M(t).

To summarize, the relationships (14)-(18) enable determining the porosity (the fraction of the material filled with fluid (∈), the size distribution of the pores and tortuosity of each path, all measurements performed in several directions by NMR alone. These data allow modelling of viscous flow permeability across a unit volume of the studied porous material. This modeling is applicable only to continuous fluid flows: natural gas, rich oil deposits uniformly wetting the rock pore surface, processing fluids. According to the Darcy equation:

$$\frac{\Delta p}{L} = \frac{128}{\pi} \cdot \frac{\mu Q}{D_c^4}, \quad (19)$$

Where:
 $\Delta P/L$ is the full gradient of lithostatic pressure in the direction of hydrocarbon flow-path,
 $D_c$ is the pore diameter,
 $\mu$ is the dynamic viscosity of the hydrocarbon, migrating toward the borehole and/or induced fractures,
 Q is the volume flow [m$^3$/sec] per the unit area.

The equation (22) incorporates the NMR-derived data:

$$\Delta P/L = (\tau/\epsilon) \times (128 \times Q \times \mu/\pi) \times [\Sigma a_1 \times (D_c)^{-4}] \quad (20)$$

Where:

∈ is the porosity of the hydrocarbon reservoir [dimensionless fraction], determined by measuring 1H magnetization M(t) in a porous sample and comparing with the bulk fluid reference, and scaling the reference data to the same volume as in the sample, τ is the diffusional tortuosity determined by the restricted diffusion analysis, $a_1$ are the volume fractions of the pore distribution, determined by NMR relaxometry. According to (20), per the same volume flow Q, a higher pressure gradient is required if the sample displays high tortuosity, low porosity, and a high fraction of micropores. Conversely, lower flow rate is expected at the same pressure gradient under the conditions as above.

In a preferred embodiment, the equation (20) is a part of a computational process for estimating the productivity of a drilling project and relating the calculated production yield to the costs (the continuity limitation was already discussed). The computational process begins with modeling of the hydrocarbon reservoir, assessing its dimensions as well as the percentage of hydrocarbon entrapped in the pores and fractures of the formation. Potential hydrocarbon deposits alter the density of the sub-terrain layers within 0.001-0.01% of g, enabling gravity surveys. Gravimeters used in geophysical surveys have an accuracy of about 0.01 milligal or mgal (1 milligal=0.001 centimeter per second per second). These devices detect differences in the Earth's gravitational field as small as one part in 100,000,000 (See Fred Aminzadeh, Shivaji N. Dasgupta, in Developments in Petroleum Science, 2013, incorporated herein by reference in entirety). Gravity modelling is supplemented by measuring magnetic anomalies, known to correlate with hydrocarbon depositions even if the nature of these anomalies is not fully understood (See Donovan T J, Forgey R L, Roberts A A. Aeromagnetic detection of diagenetic magnetite over oil fields: geologic notes. AAPG Bulletin. 1979 Feb. 1; 63(2):245-8, Reynolds R L, Fishman N S, Hudson M R. Sources of aeromagnetic anomalies over Cement oil field (Oklahoma), Simpson oil field (Alaska), and the Wyoming-Idaho-Utah thrust belt. Geophysics. 1991 May; 56(5):606-17; Eventov L. The nature and interpretation of geophysical and geochemical anomalies over oil and gas fields. The Leading Edge. 2000 May; 19(5):488-90, each incorporated herein by reference in its entirety). The observation area of gravitational and magnetic anomalies produces an estimate of horizontal dimensions for the deposit, while the intensity allows modelling the depth. At the next step, seismological studies are conducted by generating explosive shockwaves and monitoring reflection of the sound from the boundaries of the strata with different compressibility and density. The time lag before the detection of the reflected wave indicates the depth. Launching the shockwaves at different angles produces 3D seismological data, enabling tomographic analysis with improved feature resolution (See Tape C, Liu Q, Maggi A, Tromp J. Adjoint tomography of the southern California crust. Science. 2009 Aug. 21; 325(5943):988-92; Tselentis G A, Martakis N, Paraskevopoulos P, Lois A. High-resolution passive seismic tomography for 3D velocity, Poisson's ratio v, and P-wave quality QP in the Delvina hydrocarbon field, southern Albania. Geophysics. 2011 May; 76(3):B89-112; Martakis N, Landtech Enterprises Sa, Tselentis A. Parakevas Paraskevopoulos, Dept. of Seismology, University of Patras, Greece. High Resolution Passive Seismic Tomography-a NEW Exploration Tool for Hydrocarbon Investigation, Recent Results from a Successful Case History in Albania; incorporated herein by reference in entirety). Features of interest (known as "leads") are subjected to more detailed seismic surveys using the process of depth conversion to create a profile of the substructure. Finally, when a prospect has been identified and evaluated and passes the selection criteria, an exploration well is drilled to determine the presence or absence of oil or gas conclusively. The drilling step establishes the presence of the hydrocarbon deposit, may include mineralogical sampling, optionally assessment of porosity, wettability and/or hydrocarbon saturation of the rocks, optionally hydrocarbon sampling and chemical analysis. The porosity parameters are preferably measured at the explorative drilling stage to inform business decisions.

The decision to terminate is likely to follow a determination/calculation of low formation permeability and low hydrocarbon volume percentage. At certain percentages, the hydrocarbon will not migrate to the development well. At certain wettability values, the formation will retain a non-moving hydrocarbon and repel the processing fluids, complicating recovery. Additional optional considerations include the asphaltene content of the hydrocarbon, the acidity of the hydrocarbon, and the presence of catalytic poisons complicating future refining of the hydrocarbon. The decision to continue preferably includes incorporating the reservoir dimensions, horizontal and vertical distribution of the sub-zones, and permeability. The latter includes anisotropic porosity, pore distribution and tortuosity as shown in (20).

Typical threshold values for permeability, wettability index and hydrocarbon content can vary depending on reservoir pressure and rock type. Lower threshold values (i.e., a non-producible threshhold) that define from a producible boundary are as follows:

Permeability: 0.01-10 mD, 0.1-5 mD, 0.5-1 mD or about 1-3 mD (the higher the permeability, the easier the production); hydrocarbon percentage of formation rock based on weight: 10-50%, 15-40%, 20-30% or about 25% with higher values preferred; wettability index: recovery is difficult for strongly oil wet rocks (wettability index from −0.4 to −1, −0.6 to 0.8 or about −0.6); while production is relatively easier in wettability ranges of from −0.3 to 1, −0.1 to 1, or 0 to 0.5.

With the permeability values calculated/determined, and the overall suitability of the deposit affirmed, a drilling location and depth can be mapped on the model. Different sub-zones of the modeled hydrocarbon reservoir can be located at varying distances, depths and communicate with the borehole via diverse paths with generally unequal hydraulic resistivity. The estimates of horizontal and vertical permeability allow computing a profile of driving force (ΔP) and hydraulic resistivity from all sub-zones to the proposed downhole position. For more precision, the subzones are divided in volume units—voxels. The extent of fracturing is also included in the model (to extend the surface of hydrocarbon release), with the tradeoff of weakening the boreholes which require adding hydraulic pressure to stabilize the flood-work. The added hydrostatic and hydraulic pressure opposes lithostatic pressure and diminishes the driving force of the process. With all factors accounted for, a daily yield is computed together with the expected lifespan and the capital/amortization/exploitation costs of the well. The product of market price of the hydrocarbon by the yield over the borehole lifespan produces the revenue stream, while the costs are taken from the reference data. Multiple locations, well branching schemes and fracturing regimes are computationally tested until a set of the best results is identified. The choice of a permeability model is essential for the outcome of economic modeling.

Considering the limitations of NMR-only data under the realistic conditions of a processed well, supporting methods are incorporated in the analysis. In a preferred non-limiting embodiment, NMR-only data are supplemented by resistivity log data, following Archie's equation. In petrophysics, Archie's law relates the in-situ electrical conductivity of sedimentary rock to its porosity and brine saturation:

$$C_t = \frac{1}{a} C_w \phi^m S_w^n \quad (21)$$

Here,
$\phi$—is the porosity,
$C_t$—the electrical conductivity of the fluid-saturated rock,
$C_w$—represents the electrical conductivity of the brine, in the same volume as the rock,
$S_w$—is the brine saturation (fraction of the sample's volume occupied by the brine, <1),
m—is the cementation exponent of the rock (usually in the range 1.8-2.0 for sandstones, 1.7-4.1 for carbonates),
n—is the saturation exponent (usually close to 2 for sandstones and carbonates) and
a—is the tortuosity factor.
Reformulated for electrical resistivity, the equation reads:

$$R_t = a\phi^{-m} S_w^{-n} R_w \quad (22)$$

$R_t$—is the fluid-saturated rock resistivity, and
$R_w$—is the brine resistivity.
The factor $$F = \frac{a}{\phi^m} = \frac{R_o}{R_w} \quad (23)$$

is also called the formation factor, where
$R_o$—is the resistivity of the rock volume filled with only water ($S_w=1$, no solid)
$R_w$—is the resistivity of the porous rock with the enclosed water
The factor $$I = R_t/R_o = S_w^{-n}$$

is also called the resistivity index.

The cementation factor m estimates how the pore structure and connectivity increase the resistivity, as sandstone or carbonate itself is non-conductive. If porosity were to be modelled as parallel channels, a cross-section area average of the rock's resistivity would yield porosity dependence equivalent to a cementation exponent of 1. However, the tortuosity of the rock increases this to a higher number than 1. This relates the cementation exponent to the permeability of the rock; increasing permeability decreases the cementation exponent.

The saturation exponent typically approaches 2. The saturation exponent models the dependence of conductivity on the presence of non-conductive fluid (hydrocarbons) in the pore-space and is related to the wettability of the rock. Water-wet rocks will, for low water saturation values, maintain a continuous film along the pore walls making the rock conductive. Oil-wet rocks will have discontinuous droplets of water within the pore space, making the rock less conductive.

The tortuosity factor a in Archie's law is not the same as diffusional tortuosity, it is a mathematical constant, fitting the form to the observed data, thus a can be 0.5-0.6, while real tortuosity is always >1.0. However, the formation factor F is the resistivity equivalent of NMR-derived tortuosity.

Archies' law is empirical, and the constants n and m are derived on the actual samples from the oil reservoirs. Different mathematical treatments are known in the art (See Archie, G. E. (1942). "The electrical resistivity log as an aid in determining some reservoir characteristics". Petroleum Transactions of AIME. 146: 54-62; Archie, G. E. (1947). "Electrical resistivity an aid in core-analysis interpretation". American Association of Petroleum Geologists Bulletin. 31 (2): 350-366; Archie, G. E. (1950). "Introduction to petrophysics of reservoir rocks". American Association of Petroleum Geologists Bulletin. 34 (5): 943-961; Archie, G. E. (1952). "Classification of carbonate reservoir rocks and petrophysical considerations". American Association of Petroleum Geologists Bulletin. 36 (2): 278-298; Etris E L, Brumfield D, Ehrlich R, Crabtree S J. Petrographic insights into the relevance of Archie's equation: formation factor without "m" and "a. In SPWLA 30th Annual Logging Symposium 1989 Jan. 1. Society of Petrophysicists and Well-Log Analysts; Aldoleimi A M, Berta D. A new technique for deriving the resistivity parameters of Archie's equation from a combination of logs and core measurements. In Middle East Oil Show 1989 Jan. 1. Society of Petroleum Engineers; Olsen C, Hongdul T, Lykke Fabricius I. Prediction of Archie's cementation factor from porosity and permeability through a specific surface. Geophysics. 2008 March; 73(2):E81-7; each incorporated herein by reference in its entirety).

In a preferred embodiment, the resistivity log is measured in two perpendicular dimensions: between the points in the vertical direction and between the points across the well. Anisotropy of conductance follows the anisotropy detected by the NMR signals, and such finding cross-validates both methods.

Resistivity logs are electrical well logs that record the resistivity of a formation. Resistivity is usually recorded in ohm meters ($\Omega$m) and is displayed on, for example, track 4 of a well log. Three depths of resistivity can be logged (shallow, medium, and deep) that record the resistivity of the formation with increasing distance away from the borehole. Resistivity logs can be interpreted to infer information about the porosity of a formation, the water saturation, and the presence of hydrocarbons (See Evenick, J. C., 2008, Introduction to well logs & subsurface maps: PennWell Corporation; Asquith, G. and D. Krygowski, 2004, Basic well log analysis, second edition: The American Association of Petroleum Geologists, incorporated herein by reference in entirety). The resistivity logging can be likewise validated at multiple depths and directions by the inventive NMR method. Non-limiting examples of the resistivity sensors and tools, adapted for well-logging purposes are: Array Laterolog Tool (ALAT), EWR®-PHASE 4 Resistivity Sensor, Micro-Spherical Focused Log (MSFL™) and Microlog (ML) Tools by Hulliburton, the tools by Schlumberger, Century Geophysical, Weatherford International, KMS Technologies, CNPC, Daleel, PASI Geophysics Instruments, OYO Corporation, GeoVista.

The tools intended for exploration of shallow conductivity utilize direct electric contact and measure resistance to the current at the fixed voltage difference. The tools intended for measuring depth conductivity utilize electromagnetic induction. Induction-conductivity logging involves the measurement of induced electromagnetic fields in the rock and resulting eddy currents. Induction tools consist of multiple coil arrays designed to optimize vertical resolution and depth of investigation. The basic building block of multiple-coil arrays is the two-coil sonde. The sensor consists of two coaxial induction coil emitting electromagnetic waves. The processing software subtracts the direct effects of the emitter coil on the receiver coil. The alternating field of the emitter induces eddy currents in the environment which in turn produce the proportional electromagnetic signals detected by the receiver. The in-depth measurements are especially valuable to differentiate the invaded zone (permeated by the drilling fluids) and the virgin zone (where the inherent content of water and hydrocarbon in the pores more closely resembles the bulk composition in the reservoir).

The results of resistivity logging can be converted in rock permeability (See Wyllie M R J, Rose W D, Some theoretical considerations related to the quantitative evaluation of the physical characteristics of reservoir rock from electric log data, Trans AIME 189:105p, (1950)—incorporated herein by reference in entirety). Wyllie and Rose proposed an empirical equation which is a modification of the Carman-Kozeny equation (See Carman P C, Fluid flow through granular beds transactions, Inst Chem Eng Lond 15:150-166, (1937) incorporated herein by reference) that substituted irreducible water saturation for the specific area term. As the specific surface area is quite difficult to measure directly by conventional methods and therefore it is linked with pore size, this in turn controls the irreducible water saturation.

$$K = P \times \Phi^Q / S^{R_{wir}} \quad (24)$$

Where:
- K—is the permeability of the formation,
- Φ—is the porosity,
- $S_{wir}$—is the irreducible water content,
- P and R—are the empirical exponent coefficients.

The irreducible water content is a convenient proxy for pore aspect ratio, since the water bound to the surface of the pores serves as a marker of the surface (a similar idea to using $T_2$ relaxation for determining pore sizes). This irreducible water content can be found through NMR methods or capillary pressure measurements in laboratory experiments (Xiao L, Mao Z Q, Jin Y. Calculation of irreducible water saturation (S wirr) from NMR logs in tight gas sands. Applied Magnetic Resonance. 2012 Feb. 1; 42(1):113-25; Working Guide to Reservoir Engineering, 2010, Pages 97-232 in Chapter 2 titled "Formation Evaluation" by William C. Lyons, incorporated herein by reference in entirety). NMR methodology is the most reliable, segregating the fractions by relaxation times. For example, the clay bound water (non-reducible subset, CBW) responds with $T_2$=0.5-3 msec, capillary bound water (more mobile irreducible subset, BWI) responds with $T_2$=3-15 msec, free water responds with $T_2$=15-100 msec and hydrocarbons respond with $T_2$>100 msec (See Crain's Petrophysical Handbook, incorporated herein by reference). The fundamental advantage of resistivity logs is the ease of producing, and depth attribution of the data, while the disadvantage is model-dependence and insufficiency as a stand-alone technique. Resistivity logging enables modeling of porosity, tortuosity, anisotropic variations of the latter and overall permeability, especially when combined with the empirical constants or the inputs of the collaborating methods.

Sonic logging is a well logging technique/tool that provides a formation's interval transit time, designated as Δt, which is a measure of a formation's capacity to transmit seismic waves. Geologically, this capacity varies with lithology and rock textures, most notably decreasing with increasing effective porosity. This means that a sonic log can be used to calculate the porosity of a formation if the seismic velocity of the rock matrix, $V_{mat}$, and pore fluid, and $V_f$, are known.

For a relationship between sound travel time and porosity, the Wyllie time-average equation is the most accepted. According to the equation, the total travel time recorded on the log is the sum of the time the sonic wave spends travelling the solid part of the rock, called the rock matrix and the time spent travelling through the fluids in the pores. This equation is empirical and makes no allowance for the structure of the rock matrix or the connectivity of the pore spaces. The Wyllie time-average equation is:

$$\frac{1}{V} = \frac{\phi}{V_f} + \frac{1-\phi}{V_{mat}} \quad (25)$$

Where:
- V—is the measured overall seismic velocity of the formation;
- $V_f$—is the seismic velocity of the pore fluid;
- $V_{mat}$—is the seismic velocity of the rock matrix;
- ϕ—is porosity.

Pore structure can also be estimated from sonic/acoustic data (see Tao G, King M S. Porosity And Pore Structure From Acoustic Well Logging Data 1. Geophysical Prospecting. 1993 May; 41(4):435-51; Weger R J, Eberli G P, Baechle G T, Massaferro J L, Sun Y F. Quantification of pore structure and its effect on sonic velocity and permeability in carbonates. AAPG bulletin. 2009 Oct. 1; 93(10):1297-317; Sun Y F. Seismic signatures of rock pore structure. Applied Geophysics. 2004 Jul. 1; 1(1):42-9; each incorporated herein by reference in its entirety). In general, smaller pore sizes and more convoluted geometries produce more boundaries that reflect the soundwave at the same porosity fraction and the resulting measured velocity is lower for higher complexity systems. Different directions may present variable porosity and boundary complexity, accounting for anisotropy.

The comparison between NMR, resistivity and sonic logs indicate that none of these techniques is best used as a stand-alone method, especially under the conditions of rapid exploration in logging-while-drilling conditions. In all individual techniques, the underlying theoretical assumptions are simplistic, and all methods require empirical adjustments. There is a lack of a comprehensive, precise model able to correctly anticipate the productivity of the reservoir system based on rapid analysis conducted directly in the well and inform the termination of drilling of an exploratory well if the result is negative. Cutting the exploration risk in each situation of decision-making warrants a potentially significant economic effect, considering that most of the hydrocarbon sources are in unconventional forms that require stimulated production (See Arthur M A, Cole D R. Unconventional hydrocarbon resources: prospects and problems. Elements. 2014 Aug. 1; 10(4):257-64, incorporated herein by reference in its entirety).

The comprehensive permeability modelling of the present disclosure incorporates tortuosity and porosity anisotropies as features of a multivariate regression predictor, linking laboratory-validated values of permeability and laboratory-validated structural parameters of diverse formations with the NMR, resistivity and sonic parameters collected in well-logging by an integrated sensor unit. The mutually complementing character of the individual methods warrants that the coefficients of the regression model use this synergy and provide a superior analysis at a comparable cost of real-time data collection.

Preferably, the first step in this methodology is the collection of rock cores such as sandstone or carbonate cores. Different types of porous rocks are analyzed separately. Commercial providers manufacture and sell the cylindrical rock cores representing hydrocarbon reservoirs: Kocurek Industries INC., Vinci Technologies, Rockman, Bureau Veritas Commodities Canada Ltd.

Core Research Center was established to coordinate these efforts and preserves valuable rock cores for scientists and educators from government, industry, and academia. Other core depositories include Alabama Geological Survey State Oil and Gas Board Core Warehouse, Alabama Geological Survey State Oil and Gas Board Core Warehouse, Alaska Geologic Materials Center, Alaska Geologic Materials Center Online Inventory, Arizona Geological Survey (AZGS) 1993 Core Repository Report, Arkansas Geological Survey Norman F. Williams Well Sample Library, California Well Sample Repository, Connecticut Geological Survey Bedrock Core Repository, Delaware Geological Survey Outer Continental Shelf Core and Sample Repository, Florida Geological Survey Core and Cuttings Repository, Illinois State Geological Survey Geological Samples Library, Search Illinois Geological Samples Library, Iowa Geological Survey Oakdale Rock Library and Research Facility, Kansas Geological Survey Kansas Core Library, Kansas Geological Survey Kansas Rotary-cutting samples, Kentucky Geological Survey Well Sample and Core Library, Well Sample and Core Library Database Search, LACCORE National Lacustrine Core Repository, Louisiana Geological Survey Resource Center Core Repository, Maine Geological Survey Core Repository and Exploration Records, Michigan Geological Repository for Research and Education, Minnesota Department of Natural Resources Division of Lands and Minerals Drill Core Library, Mississippi Department of Environmental Quality, Environmental Geology Division, Office of Geology, Core and Sample Library Missouri Department of Natural Resources McCracken Core Library and Research Center Nebraska Conservation and Survey Division Geological Sample Repository, Nevada Bureau of Mines and Geology Great Basin Science Sample and Records Library, New Mexico Subsurface Data and Core Libraries, North Carolina Geological Survey Coastal Plain Office Core Repository, North Dakota Geological Survey Wilson M. Laird Core and Sample Library, Ohio Department of Natural Resources Geological Survey Core and Sample Repository, Oklahoma Geological Survey Core and Well Cutting Research Facility, Pennsylvania Department of Conservation and Natural Resources (DCNR), South Carolina Geological Survey Core Repository, South Dakota Geological Survey Core and Cuttings Repository, Core and Cuttings Repository Database, Texas Bureau of Economic Geology Core Research Facilities, Integrated Core and Log Database, Utah Geological Survey Core Research Center, Wisconsin Geological & Natural History Survey Research Collections and Education Center (Core Repository).

The USGS maintains the most diverse public-access core collections in the USA. A variety of core sub-collections are available in the repository, including those from oil shale development; Eniwetok Atoll; Cajon Pass, California; Yellowstone Park; and off-shore wells. In addition, CRC curates collections of cuttings (rock chips) brought to the surface during drilling operations. The core and cuttings collection is also accompanied by a large collection of thin sections, which are used to examine microscopic details of the rocks. Images of the thin sections and photographs of some cores are available for viewing and download. Files containing chemical and physical analyses, core descriptions, stratigraphic charts, and various other analyses performed by previous users of the collection can also be downloaded. The CRC houses about 2 million feet of core in the general collection of petroleum exploration and development holes as well as in specialized collections. These cores come from 33 states and about 95 percent were donated by petroleum and mining companies, State geological surveys, other Federal agencies, and universities; about 5 percent are special scientific cores drilled by the USGSAnalogous infrastructure exists outside of the USA, without limitation: Kochi Core Center Kochi University, Japan and the University of Bremen, Germany. The samples are available via an application process and released by a decision of a research board.

The cylindrical cores are sealed in a high-pressure testing cell and are subjected to permeability test using a fluid with known viscosity or with a viscosity profile emulating natural hydrocarbon (another sample of heavy oil, cracking residue, tar). Alternatively, gas or flooding brine permeability is measured. Prior to pressing through the core, the fluid (or gas) is equilibrated with water (or water vapor) and passes a pre-filter eliminating potential sediments (dust). The core is wetted by water to the extent matching the non-reducible level or to a fixed level of water content. The permeability test is repeated at 2 water saturation levels and with several oil (gas) models. After completion of the realistic permeability test, the wetted cores with the model hydrocarbons entrapped in the pores together with water are subjected to NMR, resistivity and sonic characterization. The NMR examination includes measuring overall signal strength at different chemical shifts, measuring of relaxation times for all components at different orientations of the sample, measuring water restricted diffusion coefficients, measuring diffusion anisotropy, computing porosity, pore size distribution and tortuosity based on NMR data. The core next undergoes resistivity studies at the initial and varied water contents, with the several directions of the current, to measure the anisotropy of formation factor, resistivity index and the empirical coefficients n and m in the Archie's Law form. The core also undergoes acoustic studies at several water contents and directions. After completing these tests, the core is repeatedly extracted by hot diesel oil (to prevent asphaltene deposition), the diesel oil is displaced and dissolved by heptane, and the core is dried. The dried core is subjected by a detailed porometric study and "true" tortuosity determination by xenon NMR or microscopy (See Wang R, Pavlin T, Rosen M S, Mair R W, Cory D G, Walsworth R L. Xenon NMR measurements of permeability and tortuosity in reservoir rocks. Magnetic resonance imaging. 2005 Feb. 1; 23(2):329-31; Albers B, Wilmanski K. Acoustics of two-component porous materials with anisotropic tortuosity. Continuum Mechanics and Thermodynamics. 2012 Nov. 1; 24(4-6):403-16; Wang R, Mair R W, Rosen M S, Cory D G, Walsworth R L. Simultaneous measurement of rock permeability and effective porosity using laser-polarized noble gas NMR. Physical Review E. 2004 Aug. 31; 70(2):026312; incorporated herein by reference in entirety).

The procedure is repeated for multiple samples, e.g., separately for carbonates and sandstones. The number of samples included in the training set for each group is not less than 50, preferably 75, even more preferably >100. For each sample, multiple compositions are analyzed (water contents and oil models), thus the training set may include 1000-2000 data rows, relating the high-throughput logging parameters to the observed permeabilities (wettability, mechanical strengths). For cost-efficiency, the training sets are expected to be maximally diversified to ensure that they represent the entire variety of hydrocarbon cores. In the most preferred embodiment, the cores originating in different parts of the globe are procured for characterization.

At the next step, the parameters measured by high-throughput logging tools such as NMR, resistivity and acoustic probes are fit to the true values of permeability, porosity and tortuosity obtained in laboratory experiments. Multiple fitting methods are possible, with multiple convergence and residual minimization criteria (the Least Square Method is one non-limiting embodiment).

In one non-limiting embodiment, the following expression is fitted to the experimental permeability:

$$A_1 \times [\tau_{NMR}^{B1}] \times [\tau_{RES}^{B2}] \times [\Phi_{NMR}^{B3}] \times [\Phi_{RES}^{B4}] \times [\Phi_{SONIC}^{B5}] \times [(\tau_{NMRZ})^{B6}/(\tau_{NMRXY})^{B6}] \times [(\tau_{RESZ})^{B7}/(\tau_{RESXY})^{B7}] \times [(\Phi_{SONICZ})^{B8}/(\Phi_{SONICXY})^{B8}] \times S_w^{B9} \times S_{wir}^{B10} \times R^{B11} = K \quad (26)$$

Where:
- K—is permeability, wherein $v=(K/\mu) \times \Delta P/\Delta L$ (the volume flow velocity $v$ [m/sec] is directly proportional to the pressure gradient $\Delta P/\Delta L$ [kg/sec$^2 \times$m$^2$] and structural permeability K [m$^2$ or Darcy] and is inversely proportional to dynamic viscosity $\mu$ [kg×m×s$^{-1}$]
- $A_1$—is the empirical proportionality factor,
- [$\tau_{NMR}^{B1}$]—is the diffusional tortuosity determined by NMR and B1 is the respective exponent of the fitting model to be determined in the training process.
- [$\tau_{RES}^{B2}$]—is the tortuosity determined by resistivity (or Formation Factor F) and B2 is the respective exponent of the fitting model to be determined in the training process.
- [$\Phi_{NMR}^{B3}$]—is the overall porosity determined by NMR and the respective fitting coefficient B3.
- [$\Phi_{RES}^{B4}$]—is the overall porosity determined by resistivity logging and the respective fitting coefficient B4.
- [$\Phi_{SONIC}^{B5}$]—is the overall porosity determined by acoustic probing and the respective fitting coefficient B5.
- [$(\tau_{NMRZ})^{B6}/(\tau_{NMRXY})^{B6}$]—is the ratio of diffusional tortuosity in the direction Z to one measured in the plane XY and the respective fitting coefficient B6.
- [$(\tau_{RESZ})^{B7}/(\tau_{RESXY})^{B7}$]—is the ratio of resistivity tortuosity (formation factors) measured in the direction Z to one measured in the plane XY and the respective fitting coefficient B7
- [$(\Phi_{SONICZ})^{B8}/(\Phi_{SONICXY})^{B8}$]—is the ratio of porosity determined by acoustic probing in the direction Z to the porosity determined by the acoustic probing in the plane XY, wherein B8 is the respective fitting coefficients.
- $S_w^{B9}$—is the water saturation fraction with the respective fitting factor.
- $S_{wir}^{B10}$—is the irreducible water content with the respective fitting factor.
- $R^{B11}$—resistivity at the given water saturation.

All definitions above apply to water flooding the innermost 0-5 mm of the borehole wall, the closest to the drilling in progress.

The equation (26) outwardly resembles the approach of Wyllie and Rose (equation (24) or Archie's Law. However, it principally differs by incorporation of the the anisotropies determined via diffusional tortuosity, measuring formation factors in different directions and acoustic probing in different directions. The tortuosity anisotropies reflected in (26) extend to porosities as well. All aspects of all 3 logging methods synergize in the formula (26), allowing a flexible non-linear fit to the training sample.

The form (26) is maintained for all N experimental series comprising the training set. The fitting coefficients A1 and B1-B11 are extracted from a Least Square relationship minimizing the residual between the predicted permeability based on these rapid logging metrics and the real measured permeability. An expression analogous to (26) can be written for other parameters of interest characterizing a rock. One of such parameters is water content, including irreducible water content. Another parameter is true porosity, true tortuosity, true fraction of cul-de-sacs, true anisotropy. Still another parameter, without limitation is wettability and yet another is fracturing gradient. Different sets of fitted regression coefficients link the high-throughput logging data and any true laboratory-measured data important for hydrocarbon production.

In a preferred embodiment, the 1000-2000 data points for all regimes in the training set are subdivided in the true training (50% of data) and the testing set (50% of data). The testing set is not included in the regression models extracting the coefficients A and B fitting the models to reality. Instead, the measurements conducted for the testing set are adjusted by the fitting coefficients extracted using the true training set. If the prediction is generalizable, the high throughput measurements in the testing set organized according to the rules established in the true training set predict the observed permeabilities with the same quality as in the true training set. Lack of agreement between the true training and the testing sets questions the computational approach and a different mathematical form is required to achieve reproducibility for all locations and geological histories. The most valuable models are those that correctly predict the parameters in the samples very different from the training set. As an example, an ideal training process conducted in calcite cores extracted in the USA should also correctly predict the results in dolomite or aragonite cores extracted in China without limiting. In this sense, the form (26) is only preliminary and other forms ("kernels") and convergence criteria are conceivable to achieve wide reproducibility of predictions (See Amari S I, Wu S. Improving support vector machine classifiers by modifying kernel functions. Neural Networks. 1999 Jul. 1; 12(6):783-9, incorporated herein by reference in entirety).

In a preferred embodiment, the form (26) is fitted to fracturing pressure gradient. The mechanical properties of the rock within the same mineralogical category correlate with permeability, porosity, pore distribution and geometry, acoustic properties, water absorption (See Koceir M, Tiab D. Influence of stress and lithology on hydraulic fracturing in Hassi Messaoud reservoir, Algeria. InSPE/AAPG Western Regional Meeting 2000 Jan. 1. Society of Petroleum Engineers; Shahbazi K, Abdideh M, Hadipoor M. Modelling hydraulic fracturing process in one of the Iranian southwest oil reservoirs. Applied Earth Science. 2017 Jul. 3; 126(3): 108-17; Santamaria J C, Velez E I, Bahamon J I. Differential Cased-Hole Shear Anisotropy (DCHSA) Methodology as a Calibration and Evaluation Tool of Hydraulic Fracture Height in Colombian Fields. InSPE Heavy and Extra Heavy Oil Conference: Latin America 2014 Sep. 24. Society of Petroleum Engineers, incorporated herein by reference in entirety). The empirical correlation (26) calculates tensile stresses in the rock formation, by fitting the component data to the hydraulic pressures causing fragmentation of the cores in the laboratory conditions, with the adjustments to the scale factor. The resulting set of fitting coefficients A1, B1-B11 is very different for each predicted parameter (fracturing pressure, wettability, permeability).

In a preferred embodiment, the results of the training studies are organized in an instruction set for a processor controlling the multi-sensor downhole assembly. The software optionally sends the recommendations to the human operators in response to the estimated permeability, wettability and hydrocarbon content that is compared with the economically viable cutoff. Based on the instant feedback, the expensive drilling process may be terminated if the projected depth expected for the hydrocarbon reservoir is reached. In case of substantial productivity, the acquired data can also be used to compute the position of maximal yield for branching and identify an extent of fracturing (and the stabilizing hydraulic pressure) that is the most economically viable.

In a further preferred non-limiting embodiment, the process and system of the present disclosure rely on fitting models applied to the measurements produced during drilling or after drilling with variable intervals of time after drilling. In another non-limiting variation, the fitting model (26) can be simplified to rely only on the restricted diffusion parameters and to omit the resistivity and sonic contributions (see the Examples). In a still further non-limiting variation, the model (26) is made more complex by including time-dependent terms for diffusion tortuosity measured by the NMR sequences of variable length. In a further non-limiting variation, the model is made more complex by including detergent, salinity, viscosity, temperature, pressure and turbulence effects, emulating the broad range of parameters in a borehole. The number of data rows in the training set as envisioned in this invention by far exceeds the number of potential variables, excluding the possibility of an overfit. However, working with simplified embodiments of the general fitting model (26) presents the advantages of easier classification and delineation of the functional regimes.

In further preferred non-limiting embodiments, the process and system of the present disclosure can be used to predict, design, calculate and/or facilitate any of:

pore network complexity and permeability anisotropy based on NMR diffusion measurements;

permeability anisotropy in the laboratory as well as in the field using NMR equipment or NMR logging tools;

the perforation scheme in cased hole vertical wells towards the maximum permeability value in the horizontal direction;

the perforation scheme in cased hole directional wells towards the maximum permeability value in the horizontal direction;

the perforation scheme in case hole horizontal wells towards the maximum permeability value in the horizontal direction;

the permeability profile in anisotropic porous media in carbonate reservoirs in vertical wells;

the permeability profile in anisotropic porous media in carbonate reservoirs in horizontal wells;

the permeability profile in anisotropic porous media in sandstone reservoirs in vertical wells;

the permeability profile in anisotropic porous media in sandstone reservoirs in horizontal wells;

the completion scheme in horizontal wells, extended reach wells, maximum contact wells for perforated casing completion type by identifying the maximum permeability direction in which the casing can be perforated;

the completion scheme in horizontal wells, extended reach wells, maximum contact wells for slotted liner casing completion type by identifying the maximum permeability direction in which the slots can be located to maximize the well production;

the stimulation treatment in heterogeneous long extended reach carbonate reservoirs by identifying the high permeability section and low permeability sections that exactly need the acid stimulation process;

the filter cake treatment in heterogeneous long extended reach carbonate reservoirs by identifying the high permeability section and low permeability sections that exactly need the acid stimulation process;

the filter cake treatment in heterogeneous long extended reach sandstone reservoirs by identifying the high permeability section and low permeability sections that exactly need the acid stimulation process;

the multi-stage fracturing scheme in tight sandstone to locate the fracture across the less isotropic high permeability sections of the horizontal well;

the multi-stage fracturing scheme in tight carbonate to locate the fracture across the less isotropic high permeability sections of the horizontal well; and the multi-stage fracturing scheme in unconventional shale to locate the fracture across the less isotropic high permeability sections of the horizontal well.

Having generally described this disclosure, a further understanding can be obtained by reference to certain specific examples which are provided herein for purposes of illustration only and are not intended to be limiting unless otherwise specified.

Example 1: Sample Preparation and Conducting of NMR

Rock samples: Four Limestone rock samples were cored to have a cylindrical geometry of 2 inch length and 1.5 inch diameter. Both cores were fully saturated with de-ionized water plus 0.2 g/L of HCl. The petrophysical parameters of the rock core plugs are summarized in Table 1. The samples have variable porosity and permeability values. The observed permeability does not correlate with porosity as such. For example, Pink Desert sample has lower permeability than Indiana (2) or D1 despite higher porosity. Since porosity is the most used predictor of permeability according to Kozeny-Carman approach, this lack of correlation with porosity is significant and calls for more diverse correlates between the log data and permeability.

TABLE 1

Petrophysical Properties of the Samples

| Sample Name | Porosity (%) | Permeability (mD) |
| --- | --- | --- |
| Indiana (1) | 10.81 | 0.73 |
| Indiana (2) | 17.43 | 216.89 |
| Pink Desert | 24.99 | 31.96 |
| D1 | 17.06 | 350 |

Pulsed Field Gradient NMR (PFG NMR): An NMR experiment with a timed pulse with spatial-dependent field frequency is called a pulsed field gradient NMR. There are four characteristics by which the gradient is identified:
(1) Axis in which the gradient is applied
(2) Strength of the gradient
(3) The shape of the applied gradient
(4) Duration of the gradient application.

PFG NMR Techniques are the basics of magnetic resonance imaging (MRI), and of diffusion studies by nuclear magnetic resonance. Diffusion is usually similar in every direction for most liquids and homogenous solid materials such as gels. Such materials are referred to as isotropic and have a single diffusion coefficient (D). On the other hand, reservoir rock and biological tissues are highly heterogeneous and typically have different coefficients of diffusion in different directions. PFG NMR methods are especially useful in the study of diffusion anisotropy, as mentioned earlier; here this method was applied to rocks to investigate the correlation between diffusion tortuosity and permeability. PFG-NMR experiments were carried out on an Oxford Instruments NMR Rock Core Analyzer MARAN DRX 12.2 MHz coupled with a 5.3-cm I.D radiofrequency coil and three dimensional (Gx, Gy, and Gz) magnetic field gradients with strength up to 30 G/cm. The 13-interval Bipolar Gradients pulse sequence (APFGSTE) was applied to avoid unnecessary signal attenuation. This can prevent significant error in the measurements of the restricted diffusion coefficient, $D_R$, due to the susceptibility difference, which causes internal magnetic field gradients. The signal attenuation $(S/S_0)$ for the 13-interval APGSTE sequence is given by:

$$\frac{S}{S_o} = \exp\left\{-D_R\gamma^2\left[\delta^2\left(4\Delta + 6\lambda - \frac{2\delta}{3}\right)g_a^2 + 2\lambda\delta(\delta_1 - \delta_2)g_a g_0 + \frac{4}{3}\lambda^3 g_0^2\right]\right\} \quad (27)$$

Figure 14:
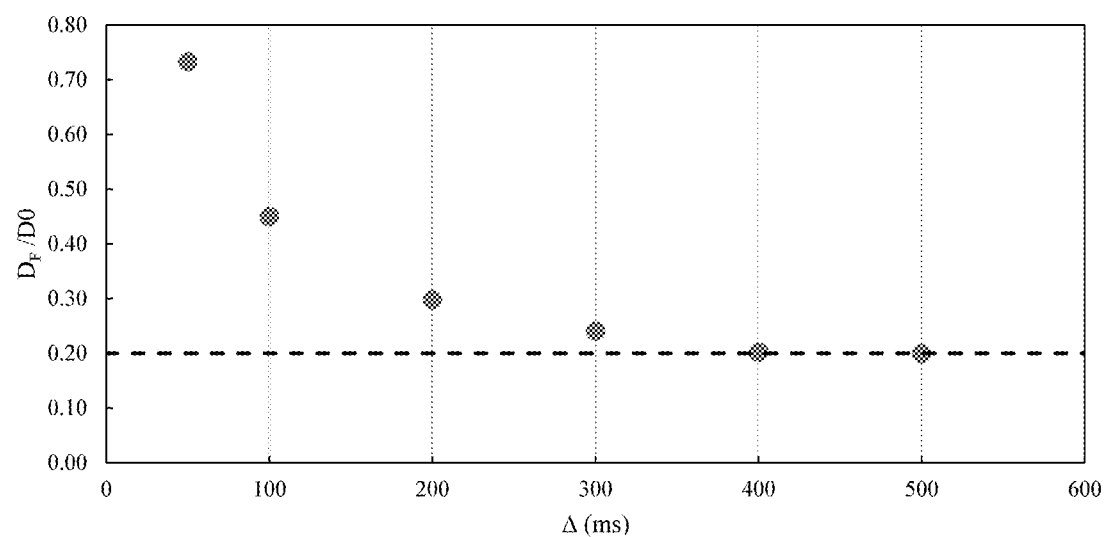
FIG. 14: Restricted diffusion coefficient of water as a function of observation time for Indiana (2). The dashed line corresponds to the asymptotic regime.

Where:
$S_0$ is the NMR signal in the absence of applied magnetic field gradients (µV).
$D_R$ is the Restricted self-diffusion coefficient of the fluid (m²/s),
$\Delta$ is the duration between two applied magnetic field 'Diffusion Time' (msec),
$\delta$ is the duration of the applied magnetic field gradient (msec).
$\gamma$ is the gyromagnetic ratio of the nucleus being studied (=2.68×10⁸ Hz/T for ¹H nucleus).
$g_a$ is the strength of the applied magnetic field gradient (T/m),
$g_o$ is strength of the internal magnetic field gradient (T/m).
$\lambda$ is the time between the first two ($\pi$/2) RF pulses (msec), and
$\delta_1$ and $\delta_2$=pre- and post-pulse time respectively (msec).
By choosing the same value for the two time periods $\delta_1$ and $\delta_2$ and selecting diffusion time larger than the time between the first two ($\pi$/2) RF pulses, the previous equation can be expressed as follows (equation 28), enabling $D_R$ to be measured from the slope of the natural logarithm of the signal attenuation versus–b'.

$$\frac{S}{S_o} = \exp\left\{-D_R\gamma^2\left[\delta^2\left(4\Delta + 6\lambda - \frac{2\delta}{3}\right)g_a^2\right]\right\} = \quad (28)$$

$$\exp\left(-D_R(2\delta\gamma g_a)^2\left(\Delta - \frac{3}{2}\lambda - \frac{\delta}{6}\right)\right)$$

where $b' = (2\delta\gamma g_a)^2\left(\Delta - \frac{3}{2}\lambda - \frac{\delta}{6}\right)$ FIG. 13 shows a representation of how the NMR gradient can be utilized to measure the anisotropic characteristic of the rock samples. If the z-direction gradient is applied, the movement of the molecules will be directed in the vertical direction of the sample, which gives an indication of the vertical permeability of the rock sample. On the other hand, if the x-direction gradient is applied, the movement of the molecules will be directed in the horizontal (radial) direction. These measurements are performed separately in order to have a single value of diffusion in each direction. The diffusion tortuosity in any experiment is calculated then by using the data at diffusion time that is large enough to reach the long-term asymptotic regime, as shown in FIG. 14. The relative difference in diffusion coefficients or $\tau_d$ measured in different directions is hypothesized to give the degree of pore geometry anisotropy for the porous media. In order to use this concept for evaluation of permeability anisotropy, diffusion tortuosity is proposed to correlate permeability.

Figure 15:
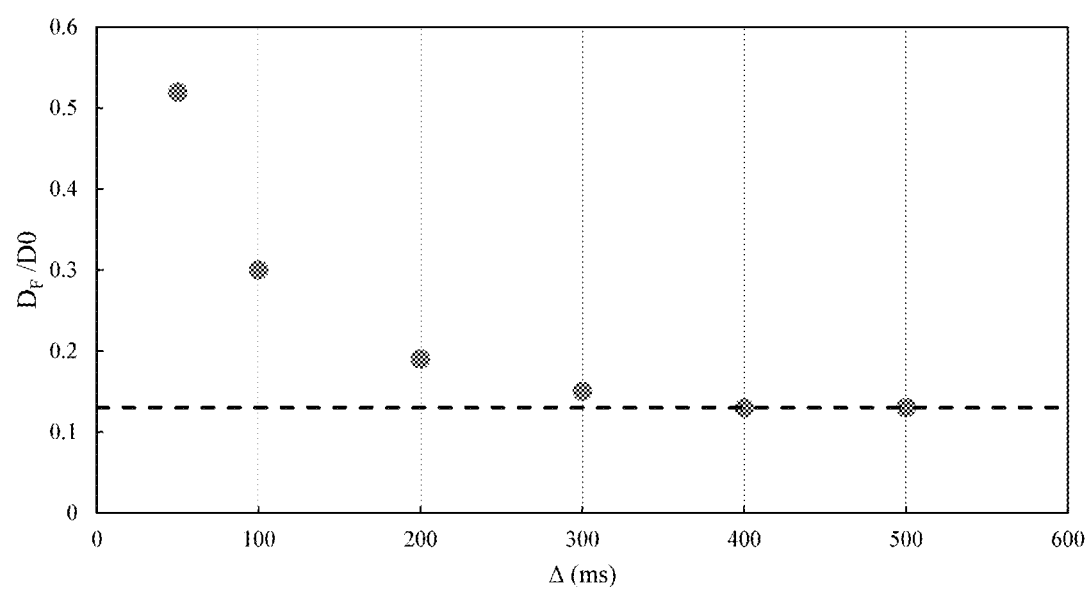
FIG. 15: Restricted diffusion coefficient of water as a function of observation time for Indiana (1).
Figure 16:
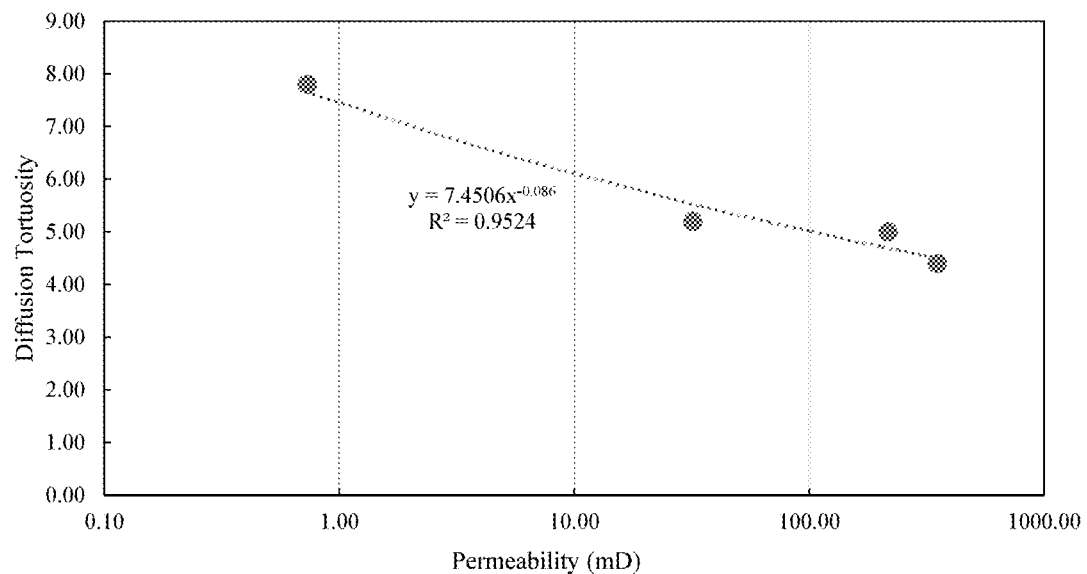
FIG. 16: Diffusion tortuosity versus permeability for the four samples. The best fine curve is shown in dashed blue. Sample A and B refer to tight and permeable samples whose 3D pore network is shown in FIGS. 17A and 17B.

Example 2: Identification of the Sufficient Time-Frame for Measurement of Restricted Diffusion Coefficients FIGS. 14 and 15 shows the inverse of diffusion tortuosity $(D_R/D_0)$ as a function of observation time for permeable and tight limestone, respectively. The results illustrate the need of planning an NMR sequence such that the 1H nuclei have time to diffuse to the pore walls. The time interval is shorter for smaller pores. The correct choice of timing is important since the ratio of the restricted and the bulk diffusion coefficients is a strong predictor of permeability and a 2-fold error in this metric can lead to orders of magnitude error in permeability (FIG. 16).

Figure 17A:
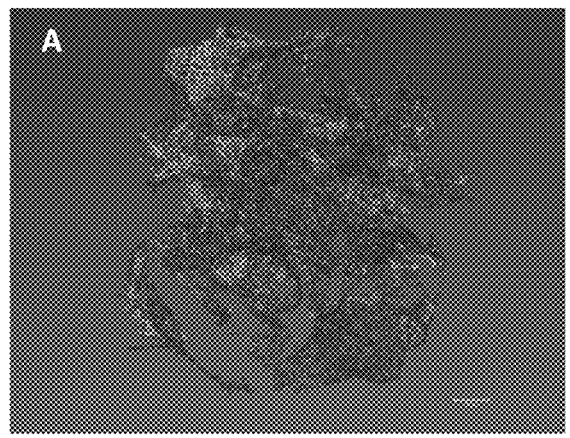
FIG. 17A: 3D image of a pore network extracted from micro CT scanning for tight Indiana limestone.
Figure 17B:
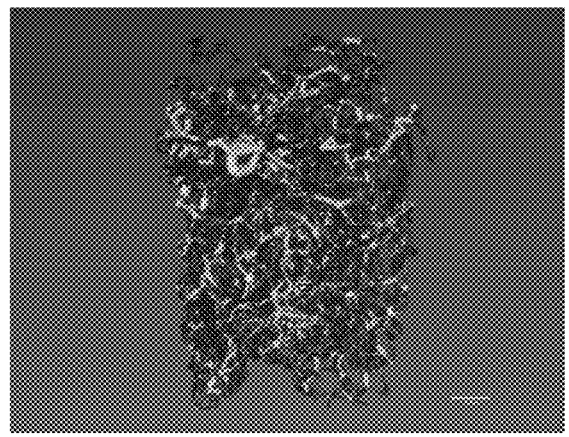
FIG. 17B: 3D image of a pore network extracted from micro CT scanning for permeable Indiana limestone.

Example 3: Diffusional Tortuosity Strongly Correlates with Permeability Across Different Cores with Diverse Structure FIG. 16 shows the relationship between the permeability of the samples and the diffusion tortuosity. Permeability increases as diffusion tortuosity decreases. This can be explained by the pore size and network complexity; sample A has higher diffusion tortuosity since it has smaller pore sizes and more complex pore network compared to sample B (FIG. 17). The strong relationship between permeability and diffusion tortuosity suggests that permeability anisotropy correlates to diffusion tortuosity anisotropy. The latter can be detected using the PFG NMR approach in the laboratory or potentially in the field (NMR logging tool). That is, in a rock made of alternating tight and permeable layers, the vertical permeability (and thus $\tau_d$) are different from the horizontal value. While the support by resistivity and sonic logging is important, the results of FIG. 16 indicate that diffusional tortuosity alone can be a strong individual predictor of permeability in at least some combinations of rock and hydrocarbon compositions. In this individual mode, the prediction is performed by relating each tortuosity index $\tau_z$ and $\tau_{xy}$ to directional permeability by the formula:

$$K_z = C_1 \times (\tau_z)^{C_2} + C_3; \; K_{xy} C_4 \times (\tau_{xy})^{C_5} + C_6 \quad (29)$$

wherein
$C_1$-$C_6$ are the empirical coefficients;
$K_z$, $K_{xy}$ are the directional permeability values [m²],
$\tau_z$, $\tau_{xy}$ are the directional diffusional tortuosity values.
To summarize, the advantage of using NMR compared to imaging or extraction of different cores is two-fold: a) it is non-invasive and requires less time; b) it can be applied in the field.

The invention claimed is:
1. A downhole method of determining permeability anisotropy with NMR in a vertical borehole, comprising:
drilling the vertical borehole in a hydrocarbon-containing geological formation, inserting an NMR apparatus into the vertical borehole, then
a) determining a first $^1$H self-diffusion coefficient ($D_b$) of bulk water in a portion of the hydrocarbon-containing geological formation where the water is present outside of the pores, by exposing the out of the pore portion of the hydrocarbon-containing geological formation to an NMR pulse gradient along an axis Z of the portion of the hydrocarbon-containing geological formation; wherein the out-the pore portion comprises brine flooding the vertical borehole, wherein the brine is measured by NMR prior to flooding, post-flooding samples of the brine extracted from the vertical borehole;
b) determining a second $^1$H self-diffusion coefficient ($D_R$) of water in a portion of the hydrocarbon-containing geological formation in a restricted porous environment by an NMR sequence with the magnetic pulse gradient along the axis Z;
c) selecting the timescale of performing the NMR sequence in (a) and (b) such that the timescale corresponds to the asymptotic minimal values of the restricted diffusion coefficients for the entire pore size distribution;
d) calculating a diffusion tortuosity value $\tau_z$ as $\tau_z = D_b/D_R$;
e) repeating steps (a)-(d) with the magnetic pulse gradient along any directions in a plane XY perpendicularly to the axis Z of the hydrocarbon-containing geological formation and computing a diffusion tortuosity metric $\tau_{xy}$;
f) determining the permeability of the hydrocarbon-containing geological formation based on a ratio of a plurality of diffusional tortuosity values measured in different directions.

2. The method of claim 1, wherein the NMR-measured diffusional tortuosity is the only parameter used to predict permeability by relating each tortuosity index $\tau_z$ and $\tau_{xy}$ to directional permeability by:

$$K_z = C_1 \times (\tau_z)^{C2} + C_3; \quad K_{xy} C_4 \times (\tau_{xy})^{C5} + C_6;$$

wherein $C_1$-$C_6$ are empirical coefficients; $K_z$, $K_{xy}$ are directional permeability values [m$^2$], $\tau_z$, $\tau_{xy}$ are directional diffusional tortuosity values.

3. The method of claim 1, wherein the NMR pulse gradient is an APGASTE 13 sequence of formula:

$$\frac{S}{S_o} = \exp\left\{-D_R \gamma^2 \left[\delta^2\left(4\Delta + 6\lambda - \frac{2\delta}{3}\right)g_a^2 + 2\lambda\delta(\delta_1 - \delta_2)g_a g_0 + \frac{4}{3}\lambda^3 g_0^2\right]\right\}$$

wherein
$S_0$ is the NMR signal in the absence of applied magnetic field gradients (μV),
$D_R$ is the restricted self-diffusion coefficient of the fluid (m$^2$/s),
$\Delta$ is the duration between two applied magnetic field 'Diffusion Time' (msec),
$\delta$ is the duration of the applied magnetic field gradient (msec),
$\gamma$ is the gyromagnetic ratio of the nucleus being studied (=2.68×10$^8$ Hz/T for $^1$H nucleus),
$g_a$ is the strength of the applied magnetic field gradient (T/m),
$g_o$ is the strength of the internal magnetic field gradient (T/m),
$\lambda$ is the time between the first two ($\pi$/2) RF pulses (msec), and
$\delta_1$ and $\delta_2$=pre- and post-pulse time respectively (msec).

4. The method of claim 3, further comprising:
deconvoluting the self-diffusion coefficient of water from hydrocarbon contributions in the NMR measurement with DOSY.

5. The method of claim 1, wherein one or more of the determining steps is carried out with a downhole sensor assembly comprising an NMR apparatus.

6. The method of claim 5, wherein the downhole sensor assembly further measures resistivity and acoustic logs.

* * * * *